United States Patent
Sela et al.

(10) Patent No.: US 11,137,932 B2
(45) Date of Patent: Oct. 5, 2021

(54) PAD INDICATION FOR DEVICE CAPABILITY

(71) Applicant: WESTERN DIGITAL TECHNOLOGIES, INC., San Jose, CA (US)

(72) Inventors: Rotem Sela, Hod Hasharon (IL); Yoseph Pinto, Tel Aviv (IL)

(73) Assignee: Western Digital Technologies, Inc., San Jose, CA (US)

(*) Notice: Subject to any disclaimer, the term of this patent is extended or adjusted under 35 U.S.C. 154(b) by 129 days.

(21) Appl. No.: 16/700,501

(22) Filed: Dec. 2, 2019

(65) Prior Publication Data

US 2021/0165595 A1   Jun. 3, 2021

(51) Int. Cl.
*G06F 3/06* (2006.01)
*G11C 13/00* (2006.01)
*G06F 13/40* (2006.01)

(52) U.S. Cl.
CPC .......... *G06F 3/0653* (2013.01); *G06F 3/0617* (2013.01); *G06F 3/0658* (2013.01); *G06F 3/0673* (2013.01); *G06F 13/4063* (2013.01); *G11C 13/004* (2013.01)

(58) Field of Classification Search
CPC ........... G06F 13/4063; G06F 653/0617; G06F 658/0673; G11C 13/004
See application file for complete search history.

(56) References Cited

U.S. PATENT DOCUMENTS

| | | | |
|---|---|---|---|
| 6,854,984 B1* | 2/2005 | Lee | G06K 19/07732 439/607.41 |
| 7,673,080 B1 | 3/2010 | Yu et al. | |
| 7,853,744 B2 | 12/2010 | Mahalingam et al. | |
| 8,171,192 B2 | 5/2012 | Maddali et al. | |
| 8,292,177 B2 | 10/2012 | Elhamias et al. | |
| RE47,638 E | 10/2019 | Fujimoto | |
| 10,440,825 B2* | 10/2019 | Pueschner | H01R 12/714 |
| 2003/0046510 A1* | 3/2003 | North | G06F 12/0886 711/203 |
| 2003/0116624 A1* | 6/2003 | Chen | G06K 19/07732 235/441 |
| 2004/0252566 A1* | 12/2004 | Chang | G06K 19/07732 365/202 |
| 2005/0182881 A1* | 8/2005 | Chou | G06F 13/385 710/301 |

(Continued)

*Primary Examiner* — Henry Tsai
*Assistant Examiner* — Aurangzeb Hassan
(74) *Attorney, Agent, or Firm* — Vierra Magen Marcus LLP

(57) ABSTRACT

Technology for detecting a capability set of a removable integrated circuit card, such as a removable memory card, is disclosed. The removable integrated circuit card has one or more capability pads that indicate a capability set of the removable integrated circuit card. The physical condition may be a physical configuration of one or more capability pads, such as size or location of a capability pad. A host device is able to determine the capability set of the removable integrated circuit card based on the physical condition of the capability pads. The host device may determine the capability set without the card being powered on, without reading a register in the card, or without exchanging commands with the card.

20 Claims, 21 Drawing Sheets

(56) References Cited

U.S. PATENT DOCUMENTS

| | | | |
|---|---|---|---|
| 2006/0161725 A1* | 7/2006 | Lee | G06F 3/0679 |
| | | | 711/103 |
| 2007/0079043 A1* | 4/2007 | Yu | G06F 13/28 |
| | | | 710/305 |
| 2008/0016082 A1* | 1/2008 | Hsu | G06F 13/385 |
| 2010/0131707 A1* | 5/2010 | Chi | G06F 13/385 |
| | | | 711/115 |
| 2011/0029703 A1* | 2/2011 | Huo | G06F 13/4068 |
| | | | 710/110 |
| 2012/0042120 A1* | 2/2012 | Ni | G06F 21/78 |
| | | | 711/103 |
| 2013/0159559 A1 | 6/2013 | Hess | |
| 2013/0342943 A1* | 12/2013 | Yuuki | H03K 19/017545 |
| | | | 361/58 |
| 2015/0143022 A1* | 5/2015 | Shacham | G06F 13/4068 |
| | | | 711/103 |
| 2015/0356040 A1* | 12/2015 | Shin | G11C 16/20 |
| | | | 711/103 |
| 2016/0027485 A1* | 1/2016 | Park | G06F 11/076 |
| | | | 365/191 |
| 2016/0240250 A1* | 8/2016 | Oh | G11C 11/1655 |
| 2016/0260494 A1* | 9/2016 | Cao | G11C 16/22 |
| 2016/0292466 A1* | 10/2016 | Lu | H04L 63/0853 |
| 2016/0365140 A1* | 12/2016 | Azuma | G11C 13/0061 |
| 2019/0205277 A1* | 7/2019 | Koh | G06F 12/0246 |
| 2020/0233818 A1* | 7/2020 | Hsieh | G06F 13/1668 |

\* cited by examiner

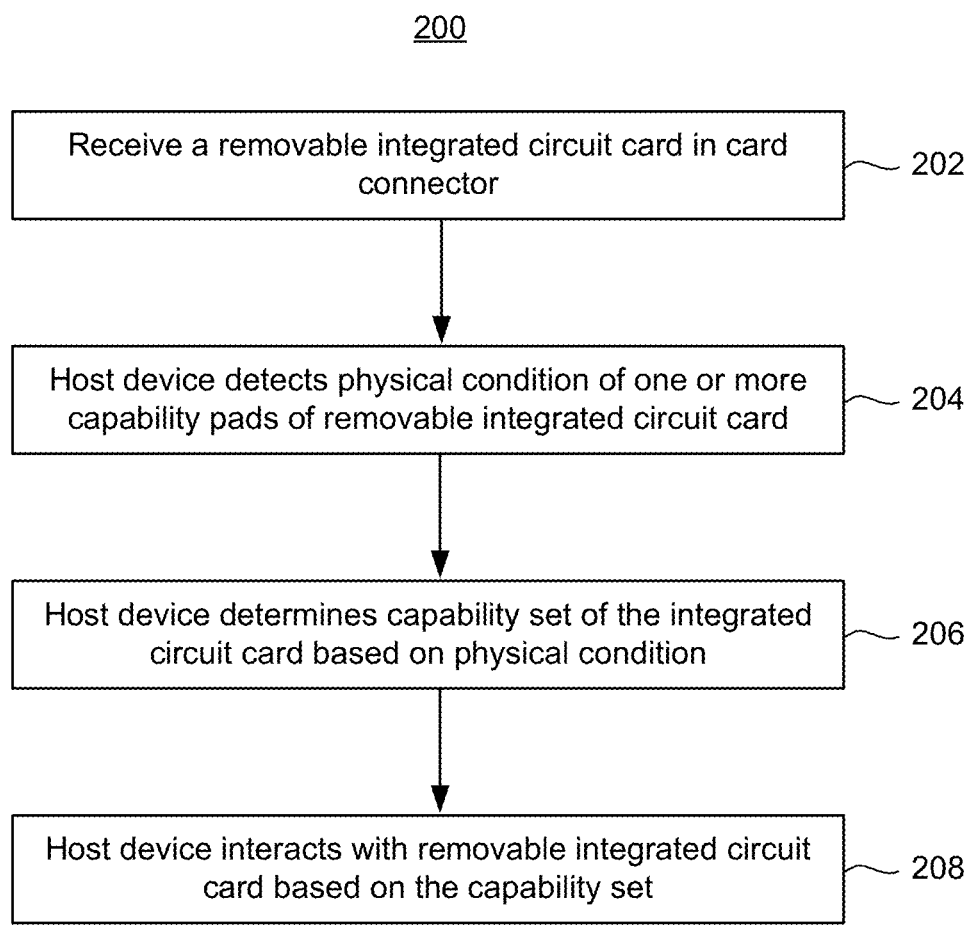

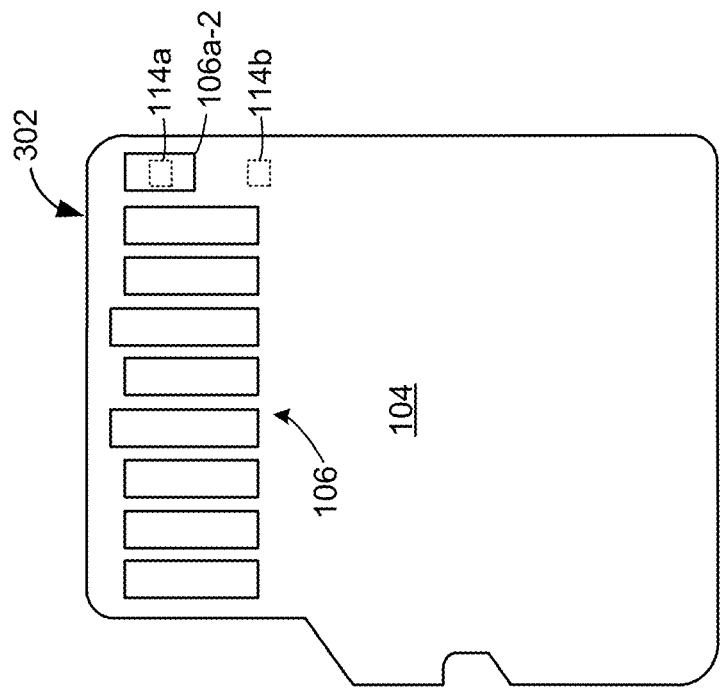
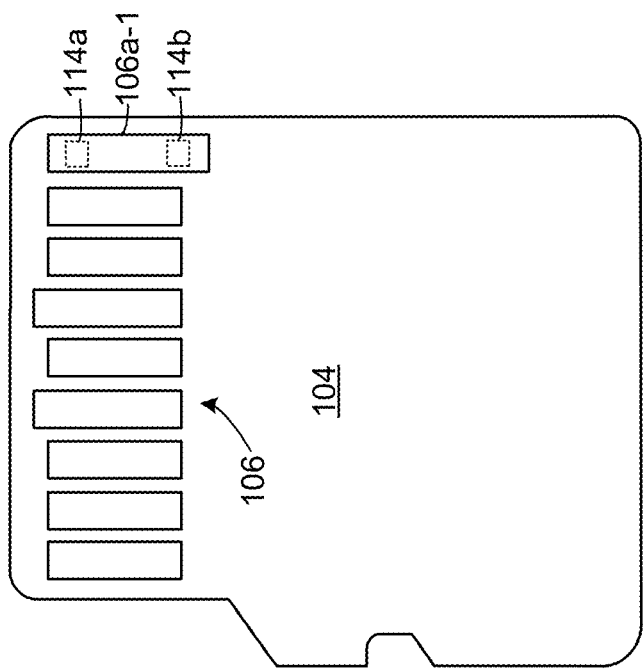

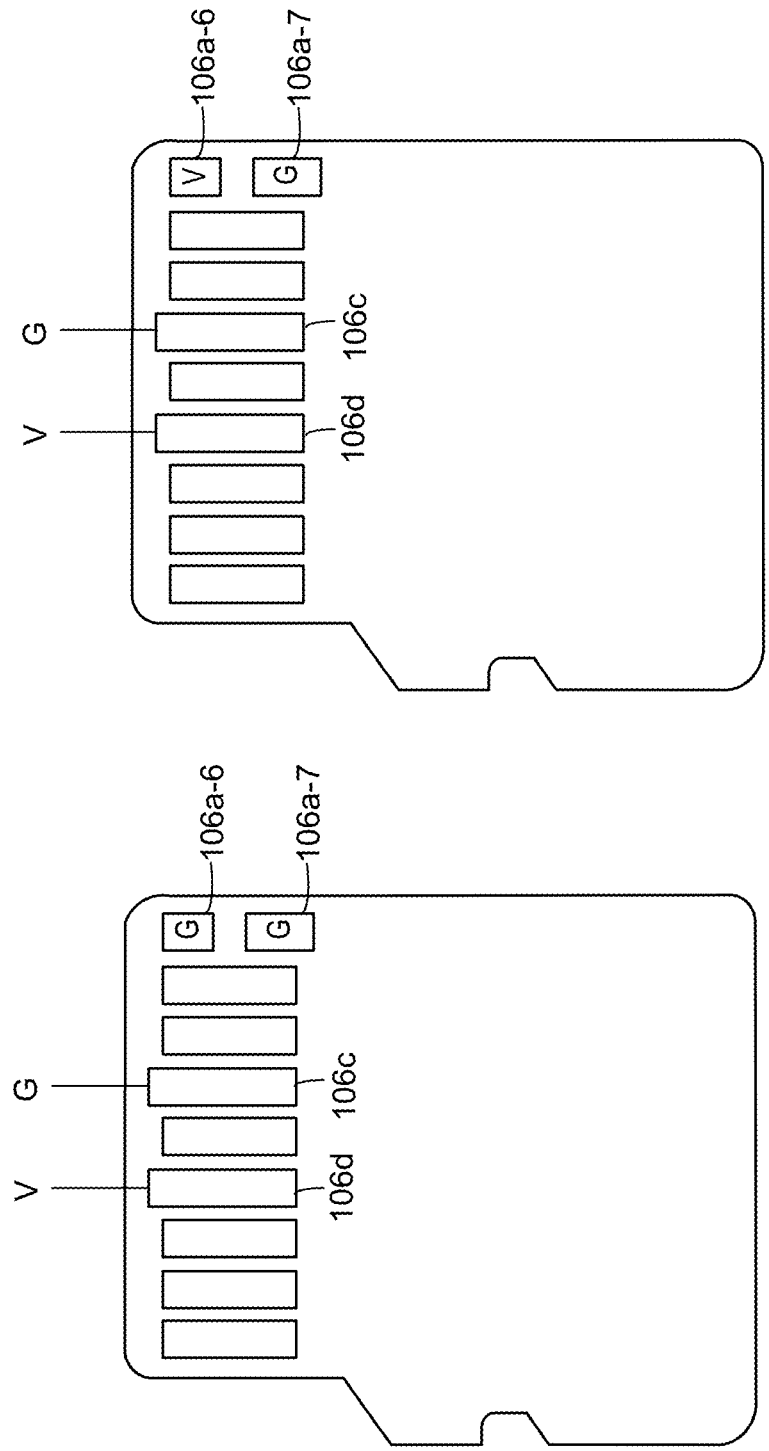

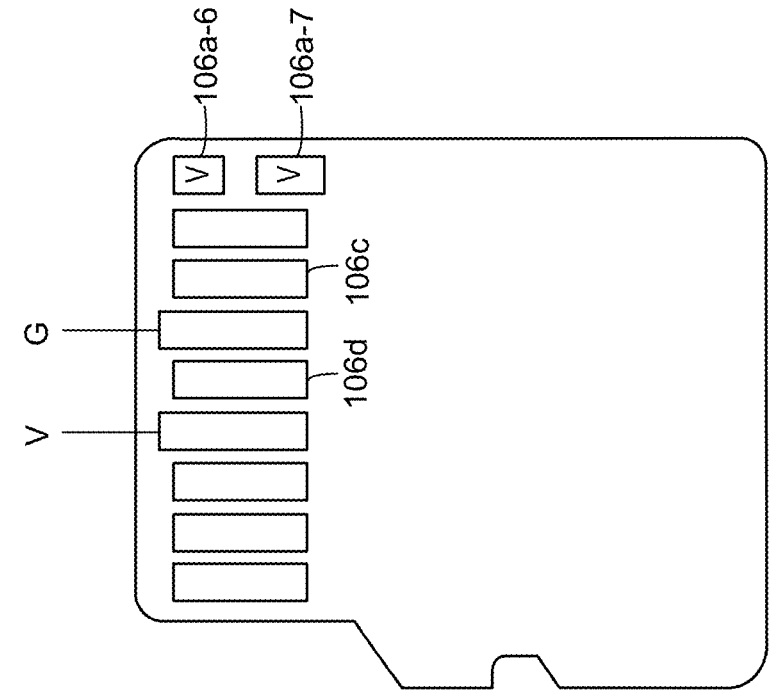
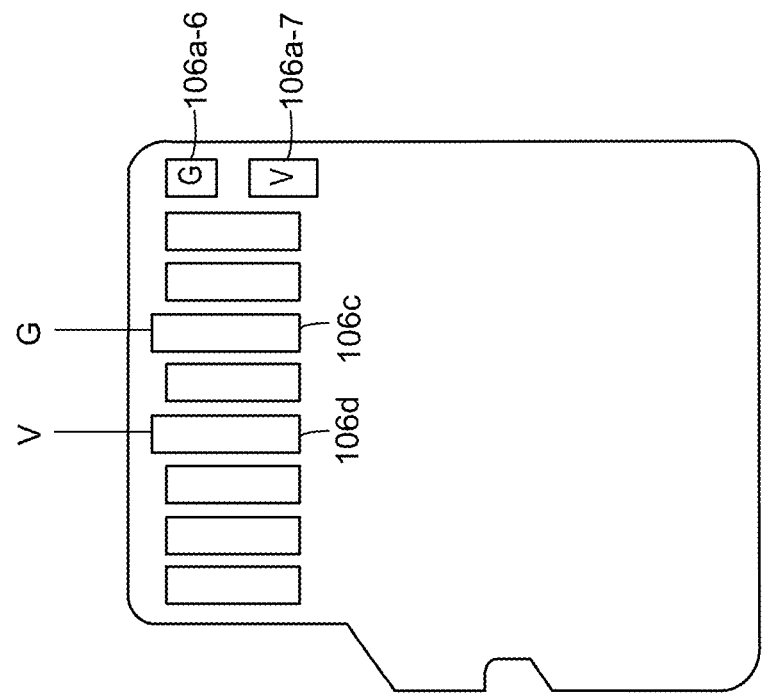

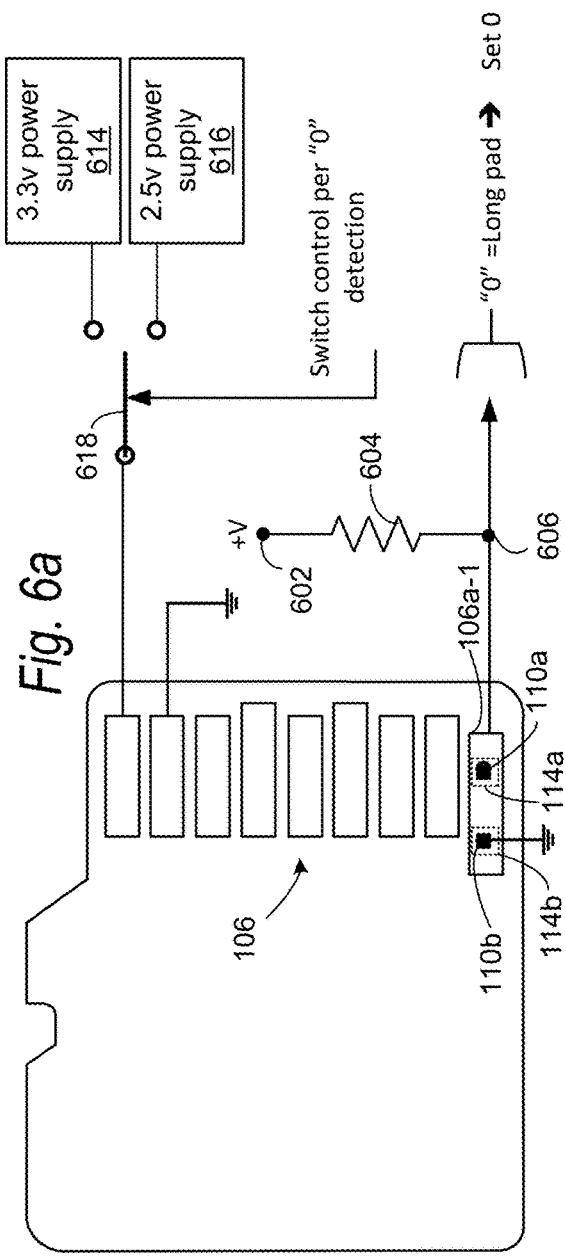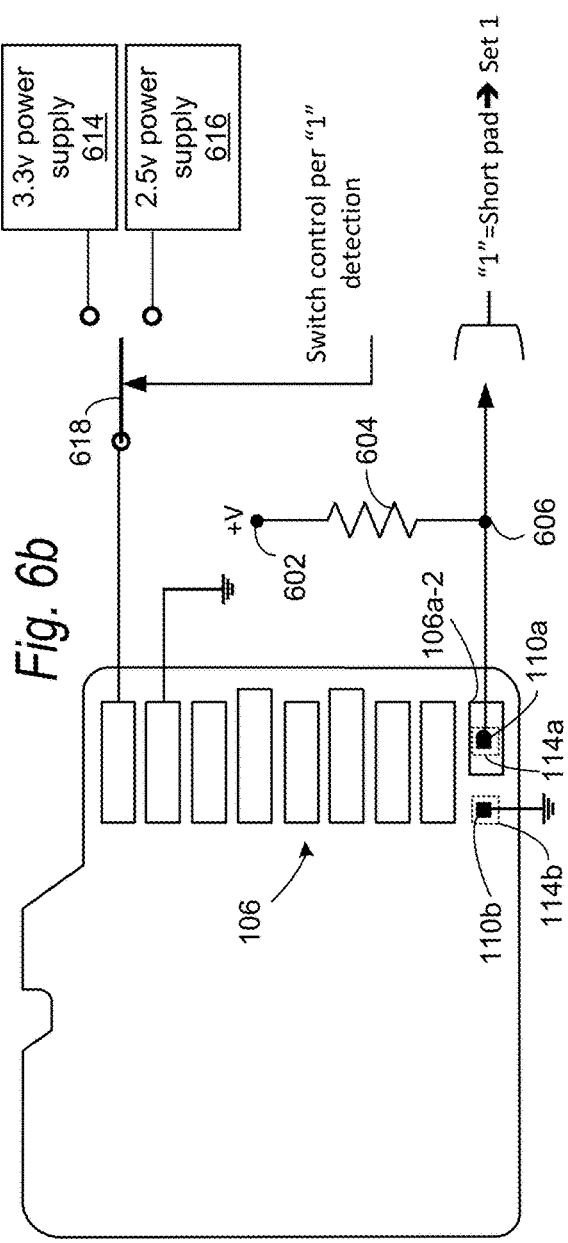

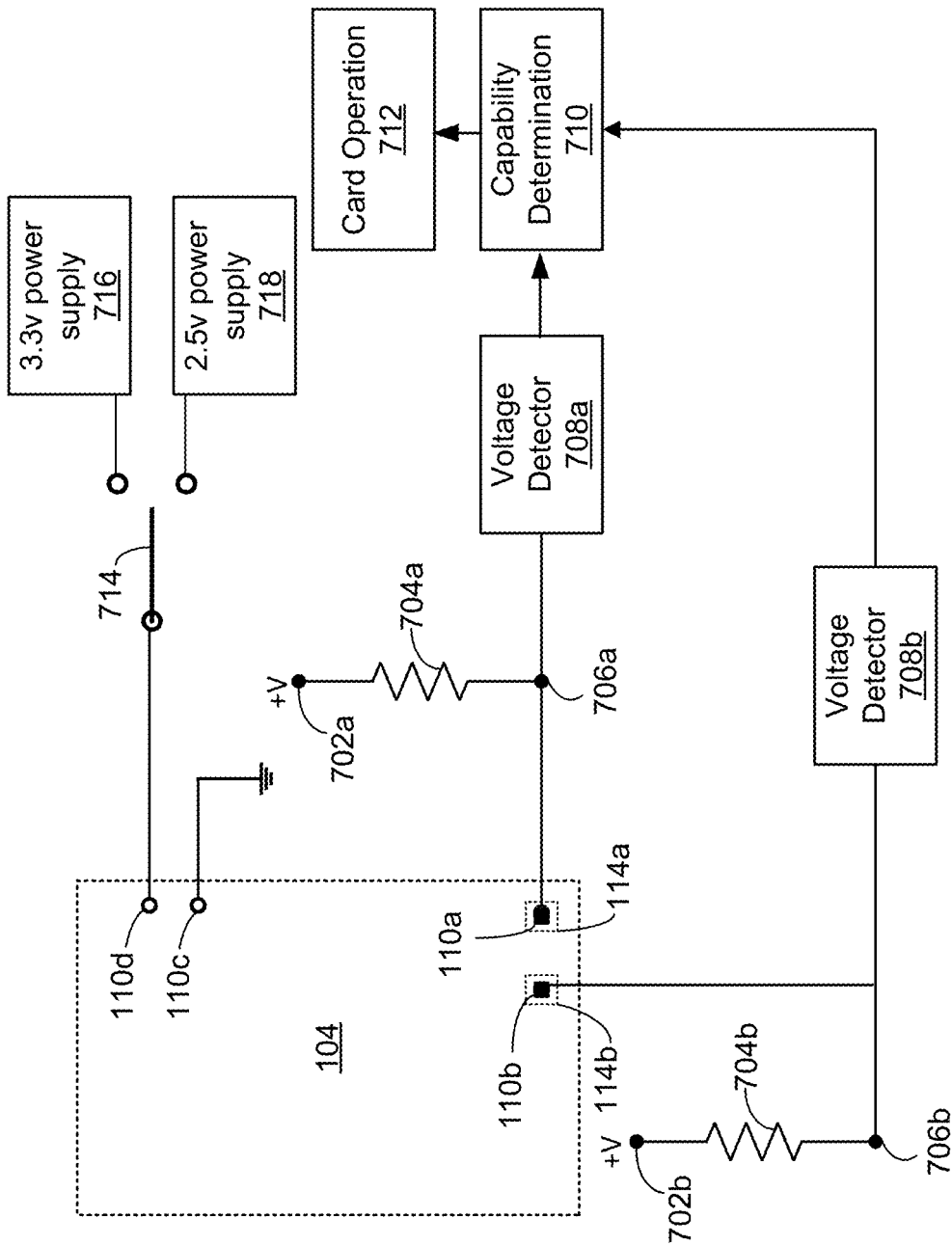

PAD INDICATION FOR DEVICE CAPABILITY

BACKGROUND

Removable integrated circuit cards, as the term is used herein, are cards that contain one or more integrated circuits and that may be repeatedly received by a host device and removed from the host device. Such removable integrated circuit cards typically have a set of interface pads (or interface pins), which are electrically conductive. The host device may have a card connector configured to receive the removable integrated circuit card. The card connector may have electrical contacts that make an electrical connection with the interface pads when the removable integrated circuit card is in the card connector.

A removable memory card is an example of a removable integrated circuit card. A removable memory card is an electronic data storage device that may be repeatedly received by a host device and removed from the host device. A removable memory card may have non-volatile memory. Examples of removable memory cards include, but are not limited to, a Secure Digital (SD) Card, a micro SD card, and a Universal Flash Storage (UFS) card.

Removable integrated circuit cards, such as removable memory cards, support a set of one or more capabilities. An example capability is an operating voltage. The operating voltage may be supplied to the removable integrated circuit card by the host device. For the sake of example, the removable integrated circuit card might be only capable of operating at a high voltage level (e.g., 3.3V) or might be capable of operating at a low voltage level (e.g., 2.5V). The operating voltage may be used for signals on a signaling interface between the removable integrated circuit card and the host device, as well as for other functions in the removable integrated circuit card. An advantage of the low voltage level is power saving, which can be important especially for battery operated host devices.

Prior to operating the removable integrated circuit card, the host device needs to determine the capabilities of the removable integrated circuit card. In one possible procedure, the host device and removable integrated circuit card undergo an initialization procedure in which information is exchanged between the host device and removable integrated circuit card. In one possible procedure, the host device reads a register in the removable integrated circuit card to learn the capabilities.

A drawback with some conventional approaches for learning the capabilities of a removable integrated circuit card is that the removable integrated circuit card may need to support a legacy capability in order for the host device to learn the capabilities. For example, during initialization the host device may determine whether the removable integrated circuit card supports a high voltage level (e.g., 3.3V) or a low voltage level (e.g., 2.5V). In one approach, the host device provides the high voltage level (e.g., 3.3V) prior to determining at which voltage level the removable integrated circuit card is capable of operating. The high voltage level may be used on the signaling interface during initialization. If the removable integrated circuit card is capable of operating at the low voltage level, then host device switches over to the low voltage level. However, this approach requires a removable integrated circuit card that is capable of operating at the low voltage level to also support the high voltage level.

Another drawback with some conventional approaches for learning the capabilities of a removable integrated circuit card is that host drivers may need to be updated when a new capability is introduced in a removable integrated circuit card. For example, techniques that rely upon the host device reading a register may require that the host drivers be updated if the removable integrated circuit card supports a new capability.

DESCRIPTION OF THE DRAWINGS

FIG. 2 depicts a flowchart of one embodiment of a process of a host device interacting with a removable integrated circuit card.

FIGS. 3a, 3b, 3c, and 3d depict embodiments of removable integrated circuit cards with different physical configurations of capability pads.

FIGS. 5a, 5b, 5c, and 5d depict an embodiment with different voltages on capability pads of a removable integrated circuit card to indicate different sets of capabilities.

FIG. 6a and FIG. 6b provide details how one embodiment of the system of FIG. 6 may be applied for two different removable integrated circuit cards.

FIG. 7 depicts one embodiment of components of a host device that are configured to distinguish between four different physical configurations of one or more capability pads.

DETAILED DESCRIPTION

Figure 1:
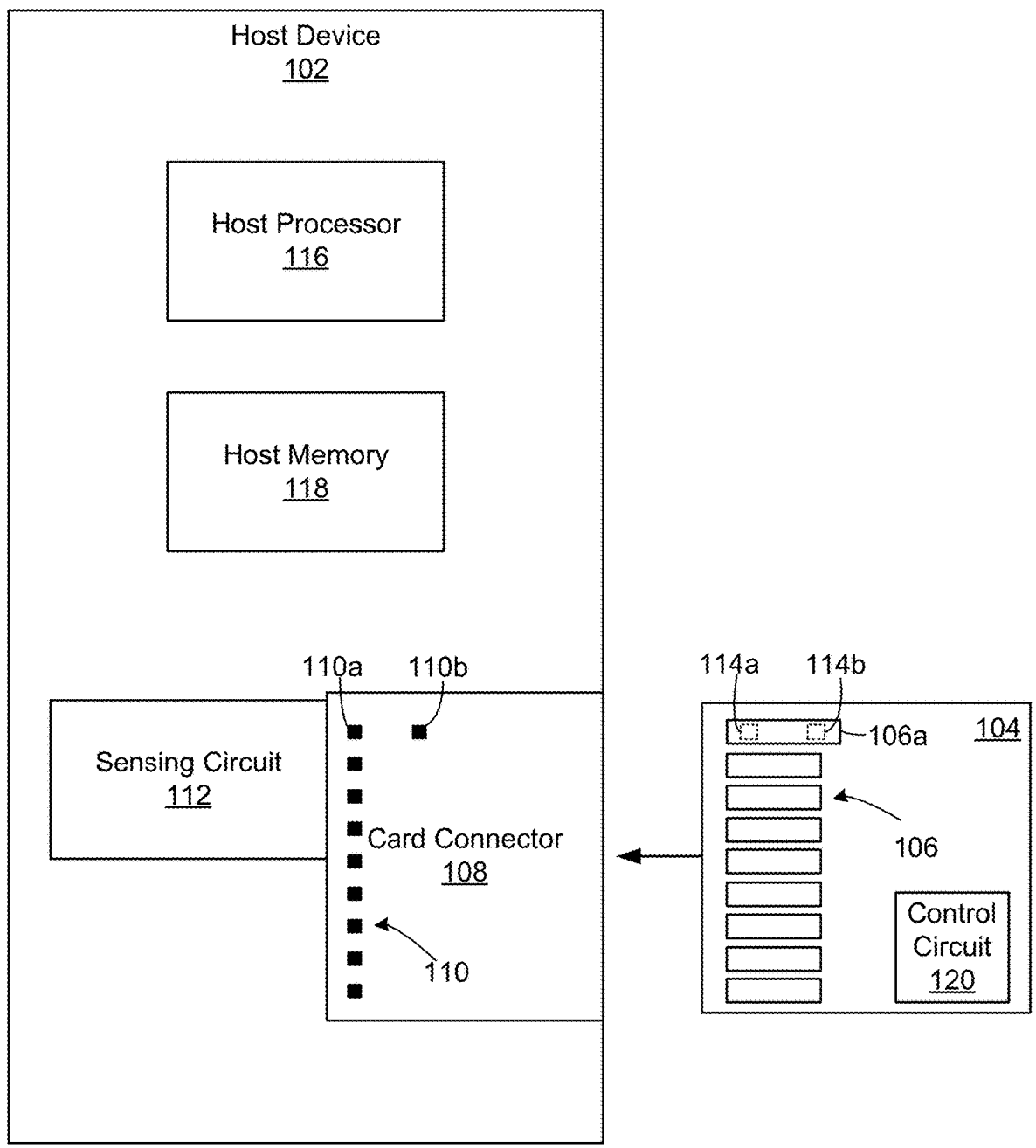
FIG. 1 depicts one embodiment of a system having a host device that is configured to accept a removable integrated circuit card.

The present technology relates to detecting one or more capabilities of a removable integrated circuit card, such as a removable memory card. The removable integrated circuit card has a set of one or more capabilities. Throughout this disclosure, "set of capabilities" or "capability set" will be understood to mean that the set includes one or more capabilities. Thus, for brevity "set of capabilities" or "capability set" may be used instead of "set of one or more capabilities." An example of a capability is a power supply voltage at which the removable integrated circuit card is capable of operating.

In one embodiment, the removable integrated circuit card has one or more capability pads. A capability pad is an interface pad that may indicate a capability set of the removable integrated circuit card. In one embodiment, the capability set is determined by a host device based on a physical condition of one or more capability pads. The physical condition may be a physical configuration of one or more capability pads. In one embodiment, the physical configuration includes a size of a capability pad. In one embodiment, the physical configuration includes a location of a capability pad. In one embodiment, the physical configuration includes the absence of a capability pad. Thus, factors including, but not limited to, size, location, and/or presence/absence of a capability pad may indicate a capability set.

In one embodiment, the host device is able to sense the physical condition of the one or more capability pads when the removable integrated circuit card is in a card connector of the host device. The host device may determine the capability set of the removable integrated circuit card based on the physical configuration. In some embodiments, the removable integrated circuit card is not required to support both a legacy capability and a newer capability in order for the host device to learn the capability set. In some embodiments, the capability set is learned with the removable integrated circuit card powered off. In some embodiments, the host device has hardware that is used to detect a capability set and make proper connections to the removable integrated circuit card based on the capability set. Hence, host drivers do not need to be updated when a new capability is added to a removable integrated circuit card.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top"/"bottom," "upper"/"lower" and "vertical"/"horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a defined component dimension.

FIG. 1 depicts one embodiment of a system having a host device 102 that is configured to accept a removable integrated circuit card 104. The host device 102 could be, but is not limited to, a desktop computer, laptop computer, a notepad computer, a digital camera, a cellular telephone, a personal digital assistant, a portable media player, an electronic keyboard, or a video game console.

In one embodiment, the removable integrated circuit card 104 is a removable memory card. However, the removable integrated circuit card 104 is not limited to being a memory card. A removable memory card is an electronic data storage device. Examples of removable memory cards include, but are not limited to, a Secure Digital (SD) Card, a micro SD card, and a Universal Flash Storage (UFS) card. The removable memory card may be configured to operate in accordance with any number of standards. In one embodiment, the removable integrated circuit card 104 is configured to operate according to the PCI-Express™ (PCIe) expansion bus standard adapted into a μSD card form factor. However, it is understood that the removable integrated circuit card 104 may be configured according to any of a variety of other standard and non-standard bus protocols. As one further example, the removable integrated circuit card 104 may be configured to operate according to the UHS-II standard. In another example, the removable integrated circuit card 104 may be configured as a Universal Flash Storage (UFS) card and may be configured to operate according to the UFS specification.

The removable integrated circuit card 104 has a number of interface pads 106. The interface pads 106 may also be referred to as interface pins. The interface pads 106 provide an electrical interface with the host device 102. Each interface pad 106 is made from an electrical conductor, such as metal. The integrated circuit card 104 in FIG. 1 has a single row of interface pads 106, but other configurations are possible. For example, some removable integrated circuit cards have two rows of interface pads. The host device 102 provides power to the removable integrated circuit card 104 via one or more of the interface pads 106. The host device 102 and the removable integrated circuit card 104 may communicate over one or more the interface pads 106 using signals whose voltage is based on the voltage level of the power provided by the host device 102. In one embodiment, the host device 102 provides a clock signal over one of the interface pads 106. The interface pads 106 may allow for other functionality.

In one embodiment, one or more of the interface pads 106 serves to indicate the capability set of the removable integrated circuit card 104. For the sake of discussion, interface pad 106a is a capability pad. Note that a capability pad 106a is formed from an electrical conductor, such as a metal. In some embodiments, the removable integrated circuit card 104 has more than one capability pad 106a. In some embodiments, the absence of a capability pad indicates a capability set of the removable integrated circuit card 104.

The host device 102 has a card connector 108 that is configured to accept the removable integrated circuit card 104. In one embodiment, the card connector 108 includes a slot in the host device 102 and a tray that fits into the slot. The tray is configured to accept the integrated circuit card 104. Therefore, the removable integrated circuit card 104 may be repeatedly received by the host device 102 and removed from the host device 102. The card connector 108 has a number of electrical contacts 110. When the integrated circuit card 104 is loaded into the card connector 108, the interface pads 106 are in electrical contact with the electrical contacts 110.

In one embodiment, the host device 102 is configured to determine the capability set of the removable integrated circuit card 104. In one embodiment, the host device 102 is configured to determine the capability set of the removable integrated circuit card 104 based on a physical condition of the one or more capability pads 106a. The physical condition could be, but is not limited to, a physical configuration of the one or more capability pads 106a or an electrical signal (e.g., voltage) that appears at respective ones of the one or more capability pads 106a. The physical configuration of the one or more capability pads 106a may include, but is not limited to, a length of a capability pad, a width of a capability pad, the number of capability pads, a physical location of a capability pad, and the presence or absence of a capability pad or portion thereof at a target location on the removable integrated circuit card 104.

In one embodiment, the sensing circuit 112 in the host device 102 is configured to determine the physical condition of the one or more capability pads. In one embodiment, one or more of the electrical contacts 110 serves as a sensing contact. In FIG. 1, for the purpose of illustration, there are two sensing contacts 110a, 110b. There may be more or fewer than two sensing contacts. The term sensing contact may be applied to any electrical contact 110 that is used by the sensing circuit 112 whether or not the sensing circuit 112 senses a signal (e.g., voltage) at the sensing contact. Each sensing contact coincides with a target location 114 on the removable integrated circuit card 104, when the removable integrated circuit card 104 is in the card connector 108. For example, sensing contact 110a will be in contact with target location 114a and sensing contact 110b with be in contact with target location 114b when the removable integrated circuit card 104 is in the card connector 108. Note that reference numeral 114 may be used to refer to a target location in general without reference to a specific target location.

In one embodiment, each sensing contact 110a, 110b is configured to sense at a target location on the removable integrated circuit card 104. For example, sensing contact 110a may be configured to sense at target location 114a when the integrated circuit card 104 is in the card connector 108. Likewise, sensing contact 110b may be configured to sense at target location 114b when the integrated circuit card 104 is in the card connector 108. The target location 114 might or might not coincide with the location of a capability pad. As will be discussed in more detail below, the capability pad 106a could be shorter than depicted in FIG. 1. In this case, target location 114b might not coincide with the capability pad 106a. In this case, it may be that sensing contact 110a will be in electrical contact with the capability pad at target location 114a when the integrated circuit card 104 is in the card connector 108. However, in this example, sensing contact 110b might not be in electrical contact with any capability pad (or even with any interface pad 106) when the integrated circuit card 104 is in the card connector 108.

The host device 102 has a host processor 116 and host memory 118. In one embodiment, the host memory 118 stores code (software) such as a set of instructions (including firmware), and the host processor 116 is operable to execute the set of instructions to sense a physical condition of the one or more capability pads, determine a capability set of the removable integrated circuit card based on the physical condition, and/or operate the removable integrated circuit card based on the capability set. In some embodiments, the combination of sensing circuit 112 and host processor 116 are referred to as one or more control circuits. In one embodiment, the combination of host processor 116, host memory 118, and sensing circuit 112 is referred to as one or more control circuits. The one or more control circuits are not required to include processor 116. In some embodiments, the host device 102 has hardware that senses a physical condition of the one or more capability pads, determines a capability set of the removable integrated circuit card based on the physical condition, and/or operates the removable integrated circuit card based on the capability set. A control circuit can include a processor, PGA (Programmable Gate Array, FPGA (Field Programmable Gate Array), ASIC (Application Specific Integrated Circuit), integrated circuit or other type of circuit.

The removable integrated circuit card 104 has one or more control circuits 120 configured to operate the memory card in accordance with the capability set. The one or more control circuits 120 could include a processor, PGA (Programmable Gate Array, FPGA (Field Programmable Gate Array), ASIC (Application Specific Integrated Circuit), integrated circuit or other type of circuit. In one embodiment, the removable integrated circuit card 104 is a removable memory card having non-volatile memory, and the one or more control circuits 120 includes a memory controller.

FIG. 2 depicts a flowchart of one embodiment of a process 200 of a host device interacting with a removable integrated circuit card. The removable integrated circuit card 104 may be a memory card, but is not limited thereto. Reference will be made to FIG. 1 to discuss process 200; however, process 200 is not limited to FIG. 1.

Step 202 includes the host device 102 receiving a removable integrated circuit card 104 in a card connector 108 of the host device 102. The removable integrated circuit card 104 may have one or more capability pads 106a.

Step 204 includes the host device 102 detecting a physical condition of the one or more capability pads 106a of the removable integrated circuit card 104. In one embodiment, the host device 102 detects a physical configuration of the one or more capability pads 106a. In one embodiment, the host device 102 detects a shape of a capability pad 106a. In one embodiment, the host device 102 detects a length of a capability pad 106a. In one embodiment, the host device 102 detects a width of a capability pad 106a. In one embodiment, the host device 102 detects the number of capability pads 106a in a target region of the removable integrated circuit card 104. In one embodiment, the host device 102 detects a voltage at a capability pad 106a.

Step 206 includes the host device 102 determining a capability set of the removable integrated circuit card 104 based on the physical condition. In one embodiment, the host device 102 determines a voltage level at which the removable integrated circuit card 104 is capable of operating. For example, the host device 102 may determine whether the removable integrated circuit card 104 supports a 3.3V level or a 2.5V level.

Step 208 includes the host device 102 interacting with the removable integrated circuit card 104 based on the capability set of the integrated circuit card 104. In one embodiment, the host device 102 provides a power supply voltage to the removable integrated circuit card 104, wherein the magnitude of the power supply voltage depends on a capability set of the removable integrated circuit card 104. For example, a circuit in the host device 102 may operate a switch to, for example, connect the power supply voltage. In one embodiment, the host device 102 communicates with the removable integrated circuit card 104 using signals whose voltage level is specified by the capability set of the removable integrated circuit card 104. In one embodiment, this communication is over one or more interface pads other than the one or more capability pads 106a. In one embodiment, this communication is over one or more capability pads 106a.

In some embodiments, steps 204 and 206 are performed while the removable integrated circuit card 104 is powered off. Steps 204 and 206 may be performed prior to the host device 102 exchanging information with the removable integrated circuit card 104 as part of an initialization process of the removable integrated circuit card 104. Steps 204 and 206 may be performed prior to the host device 102 sending any commands to the removable integrated circuit card 104. Steps 204 and 206 may be performed without the host device 102 reading any registers within the removable integrated circuit card 104.

As discussed above, some techniques may require that a removable integrated circuit card 104 that supports a newer capability (such as low voltage level) also support a legacy capability (such as a legacy higher voltage level). Process 200 does not have such a requirement. A factor in the ability to of process 200 to avoid such a requirement is that the host device 102 is able to learn the capability set very early. For example, the host device 102 can learn the capability set while the removable integrated circuit card 104 is powered off, prior to the host device 102 exchanging information with the removable integrated circuit card 104, prior to the host device 102 sending any commands to the removable integrated circuit card 104, and/or without the host device 102 reading any registers within the removable integrated circuit card 104. Hence, the design of the removable integrated circuit card 104 may be simplified, thereby providing considering cost savings.

In one embodiment, a physical configuration of one or more capability pads indicates a capability set of a removable integrated circuit card 104. FIGS. 3a, 3b, 3c, and 3d depict four different physical configurations for an embodiment of a capability pad of an integrated circuit card 104. The four different physical configurations may therefore be used to indicate up to four different capability sets. Alternatively, any two different physical configurations may be used to indicate up to two different capability sets. Alternatively, any three different physical configurations may be used to indicate up to three different capability sets.

Figure 3C:
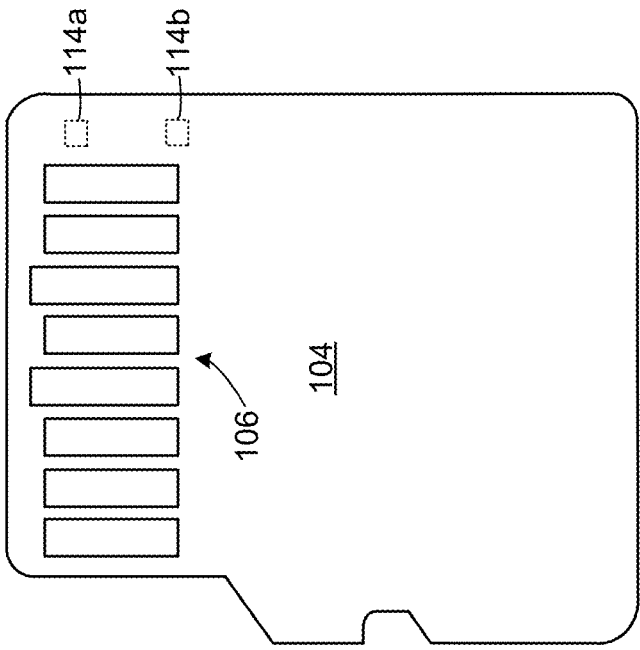
Figure 3D:
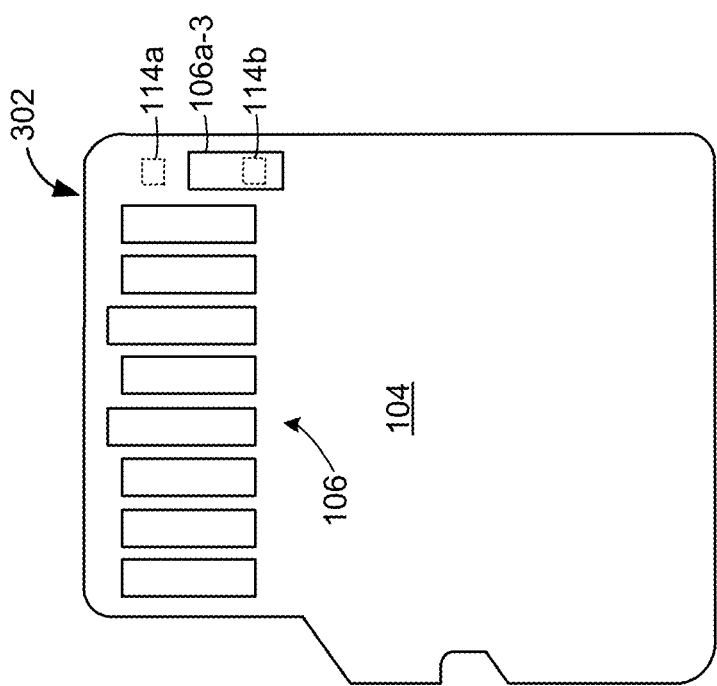

FIG. 3a depicts an embodiment of a removable integrated circuit card 104 having capability pad 106a-1. FIG. 3b depicts an embodiment of a removable integrated circuit card 104 having capability pad 106a-2. FIG. 3c depicts an embodiment of a removable integrated circuit card 104 having capability pad 106a-3. FIG. 3d depicts an embodiment of a removable integrated circuit card 104 that does not have a capability pad. Target locations 114a and 114b are also depicted in each of FIGS. 3a, 3b, 3c, and 3d. The target locations 114a and 114b are locations in the respective removable integrated circuit cards 104 that coincide with sense contacts when the removable integrated circuit card 104 is in the card connector 108.

In one embodiment, the physical configuration of the one or more capability pads includes a length of one or more capability pads 106a. Thus, in one embodiment, the length of a capability pad 106a may be used to indicate a capability set of the removable integrated circuit card 104. For example, the capability pad 106a-1 in FIG. 3a is longer than the capability pad 106a-2 in FIG. 3b. Likewise, the capability pad 106a-1 in FIG. 3a is longer than the capability pad 106a-3 in FIG. 3c. In one embodiment, the host device 102 senses at target locations 114a and 114b in order to determine the length of the capability pad 106a.

In one embodiment, the location of the capability pad 106a may be used to indicate a capability set of the removable integrated circuit card 104. For example, the capability pad 106a-2 in FIG. 3b is located closer to a front edge 302 of the removable integrated circuit card 104 than the capability pad 106a-3 in FIG. 3c. In one embodiment, the host device 102 senses at target locations 114a and 114b in order to determine the location of the capability pad 106a.

In one embodiment, the presence or absence of a capability pad 106a may be used to indicate a capability set of the removable integrated circuit card 104. For example, in FIG. 3d, the removable integrated circuit card 104 does not have a capability pad 106a. In one embodiment, the host device 102 senses at target locations 114a and 114b in order to determine whether or not the removable integrated circuit card 104 has a capability pad 106a at either of those target locations.

Figure 4:
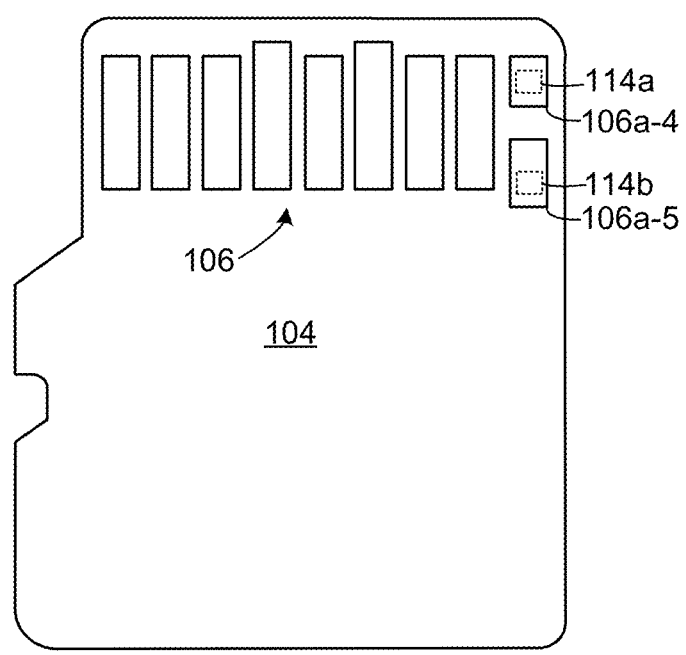
FIG. 4 depicts an embodiment of a removable integrated circuit card having two capability pads.

In one embodiment, the number of capability pads is used to indicate a capability set of a removable integrated circuit card 104. The number of number of capability pads is an example of a physical configuration of one or more capability pads. FIG. 4 depicts an embodiment of a removable integrated circuit card 104 having two capability pads 106a-4 and 106a-5. In one embodiment, the host device 102 senses at target locations 114a and 114b in order to determine how many capability pads that the removable integrated circuit card 104 has. In one embodiment, the host device 102 distinguishes between a single capability pad 106a-1 in FIG. 3a and two capability pads 106a-4 and 106a-5 in FIG. 4. In one embodiment, the host device 102 distinguishes between a single capability pad 106a-2 in FIG. 3b and two capability pads 106a-4 and 106a-5 in FIG. 4. In one embodiment, the host device 102 distinguishes between a single capability pad 106a-3 in FIG. 3c and two capability pads 106a-4 and 106a-5 in FIG. 4.

In one embodiment, the two capability pads 106a-4, 106a-4 are electrically connected internally in removable integrated circuit card 104. This allows the two relatively short capability pads 106a-4, 106a-4 to be interpreted by the host device 102 as a single relative long capability pad (see, for example, capability pad 106a-1 in FIG. 3a). Thus, such an internally connected configuration of the two capability pads 106a-4, 106a-4 in FIG. 4 is an alternative to capability pad 106a-1 in FIG. 3a.

In one embodiment, the physical condition of one or more capability pads 106a that the host device 102 detects are voltages at respective capability pads 106a. In some embodiments, the removable integrated circuit card 104 provides voltages on respective capability pads 106a in order to indicate its capability set. FIGS. 5a-5d depict how voltages on a pair of capability pads may be used to indicate which capability set of up to four capability sets is supported by the integrated circuit card 104.

In one embodiment, the removable integrated circuit card 104 creates the voltages on the capability pads 106a based on voltages that it receives on other interface pads 106. For example, the integrated circuit card 104 may receive a first voltage (G) on interface pad 106c and a second voltage (V) on interface pad 106d. The host device 102 may provide these two voltages. The two voltages could be any two voltages that have a different magnitude. These may be voltages that the host device 102 would normally provide during operation. However, the host device 102 is not required to learn whether the removable integrated circuit card 104 is capable of operating at, for example, 3.3V or 2.5V in order to provide the voltages. The term G is used to indicate that the first voltage may be a ground voltage. The term V is used to indicate that the second voltage may be a positive voltage. Other terms could be used such as providing Vs on interface pad 106c and providing VD on interface pad 106d, where VD has a larger magnitude than Vs. In this context, Vs could be considered to be ground. Note that it is not required that one of the voltages be ground.

Based on the two voltages, there are four combinations of voltages on the capability pads 106a depicted in FIG. 5a-5d. Specifically, in FIG. 5a, the removable integrated circuit card 104 connects the first voltage (G) to capability pad 106a-6 and also to capability pad 106a-7. In FIG. 5b, the removable integrated circuit card 104 connects the second voltage (V) to capability pad 106a-6 and connects the first voltage (G) to capability pad 106a-7. In FIG. 5c, the removable integrated circuit card 104 connects the first voltage (G) to capability pad 106a-6 and connects the second voltage (V) to capability pad 106a-7. In FIG. 5d, the removable integrated circuit card 104 connects the second voltage (V) to capability pad 106a-6 and also connects the second voltage (V) to capability pad 106a-7.

A concept in FIGS. 5a to 5d may be modified to cases in which there are more or fewer than two capability pads 106a. For example, with one capability pad 106a the removable integrated circuit card 104 may connect either the first voltage (G) or the second voltage (V) to the single capability pad 106a. In this manner, the removable integrated circuit card 104 may indicate a capability set out of two possible capability sets. As another example, with three capability pads 106a the removable integrated circuit card 104 may connect either the first voltage (G) or the second voltage (V) to respective ones of the three capability pads 106a. In this manner, the removable integrated circuit card 104 may indicate a capability set out of eight possible capability sets.

As noted above, the host device 102 is able to determine a capability set of the integrated circuit card 104 based on a physical condition of the one or more capability pads 106a. In some embodiments, the physical condition of the one or more capability pads includes a physical configuration of the one or more capability pads 106a. The physical configuration could include one or more of, but is not limited to, a length of a capability pad, a width of a capability pad, the number of capability pads, a physical location of a capability pad, and the presence or absence of a capability pad or portion thereof at a target location on the removable integrated circuit card 104.

Figure 6:
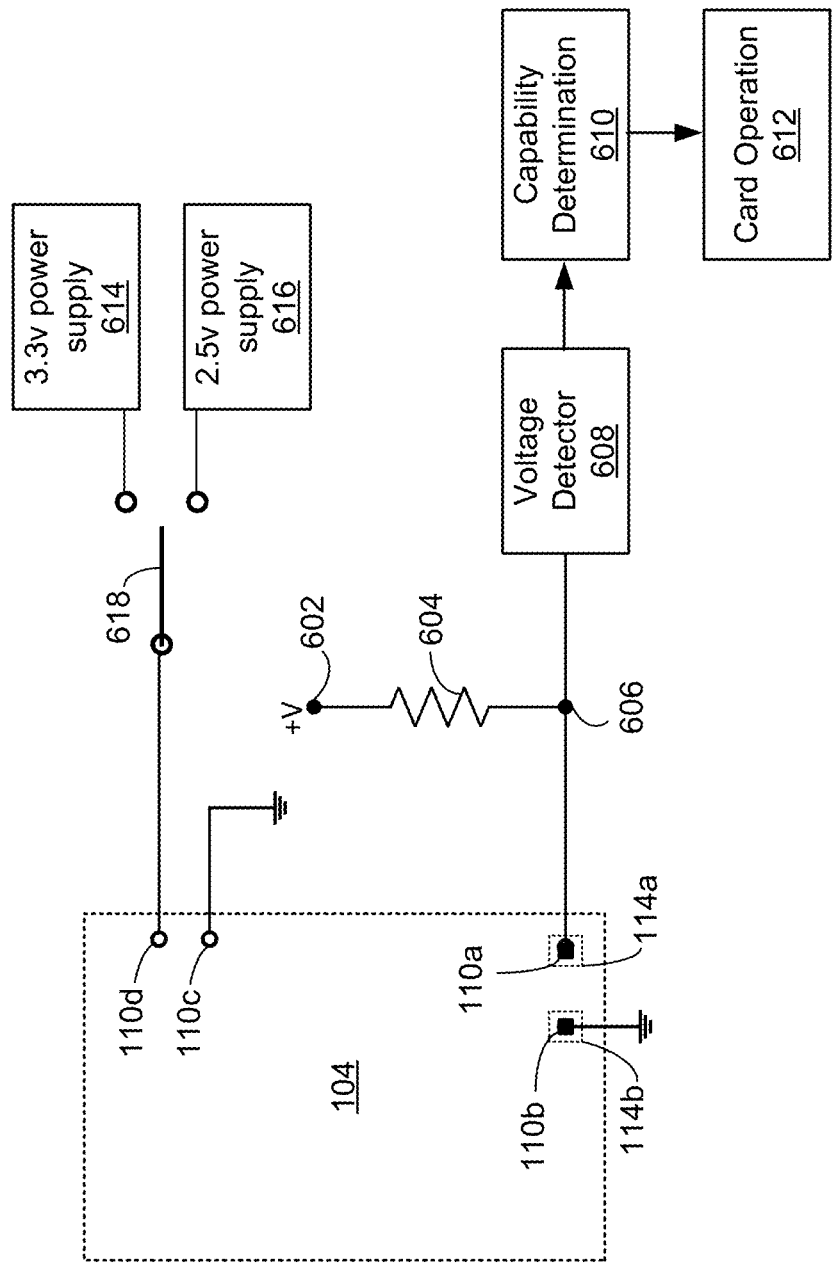
FIG. 6 depicts one embodiment of components of a host device that are configured to sense a physical configuration of one or more capability pads of an integrated circuit card.

FIG. 6 depicts one embodiment of components of a host device 102 that are configured to sense a physical configuration of one or more capability pads of an integrated circuit card 104. The components are further able to determine a capability set of the integrated circuit card 104 based on the sensed physical condition. The components are further able to operate the removable integrated circuit card 104 based on the capability set. In one embodiment, the components are able to determine a physical length of a capability pad 106a. In one embodiment, the components are able to distinguish between a longer capability pad (e.g., capability pad 106a-1 in FIG. 3a) and a shorter capability pad (e.g., capability pad 106a-2 in FIG. 3b).

A removable integrated circuit card 104 is depicted in dashed lines to indicate a relative location of the removable integrated circuit card 104 to certain components of the host device 102, such as sensing contacts 110a, 110b. An example in which there are two target locations 114a, 114b on the removable integrated circuit card 104 is depicted. There may be more or fewer than two target locations 114 on the removable integrated circuit card 104.

The host device 102 provides voltage (+V) to Node 602, which is connected to one end of resistive element 604. In one embodiment, resistive element 604 includes a resistor. The resistive element 604 could include other circuit elements such as a transistor. For example, a transistor may be configured to operate as a resistive element. The other end of resistive element 604 is connected to Node 606, which is connected to sensing contact 110a. The host device 102 connects sensing contact 110b to ground. In one embodiment, the removable integrated circuit card 104 is not powered on when the host device 102 senses the physical condition of the one or more capability pads. However, note that if the capability pad is electrically connected to both sensing contact 110a, 110b, then there will be a short circuit between the two sensing contacts 110a, 110b. This short circuit will connect Node 606 to ground, with the voltage (+V) that is applied to resistive element 604 being dissipated across resistive element 604. On the other hand, if the capability pad is not electrically connected to both sensing contact 110a, 110b, then the voltage at Node 606 will be the voltage at Node 602 minus the voltage across resistive element 604. Assuming that resistive element 604 is a resistor and no current flows through the resistor, the voltage at Node 606 will be +V. Resistive element 604 is not required to be a resistor. Resistive element 604 could be any resistive element that can absorb the voltage difference between Node 602 and Node 606 when Node 606 is grounded.

The voltage detector 608 is configured to detect a voltage at Node 606. In other words, the voltage detector 608 is configured to detect a voltage at sensing contact 110a. In one embodiment, the voltage detector 608 compares the magnitude of the voltage at Node 606 with a reference voltage. The voltage detector 608 outputs a signal to the capability determination 610 that indicates whether the voltage at Node 606 is greater than or less than the reference voltage. In one embodiment, voltage detector 608 comprises a comparator. The comparator inputs a reference voltage and the voltage at Node 606, and outputs a signal that indicates whether the voltage at Node 606 is greater than the reference voltage. In one embodiment, the voltage detector 608 and resistive element 604 are part of the sensing circuit 112.

The capability determination 610 is configured to determine the capability set based on the signal from the voltage detector 608. In one embodiment, if the signal indicates that the voltage at Node 606 is greater than the reference voltage, then this indicates that the removable integrated circuit card 104 has a relatively short capability pad 106a (such as in FIG. 3b). In one embodiment, if the signal indicates that the voltage at Node 606 is less than the reference voltage, then this indicates that the removable integrated circuit card 104 has a relatively long capability pad 106a (such as in FIG. 3a).

The capability determination 610 then determines which of two sets of capabilities that the removable integrated circuit card 104 has based on whether the removable integrated circuit card 104 has a relatively long capability pad 106a or a relatively short capability pad 106a. In one embodiment, one of the capabilities in the first set is that the removable integrated circuit card 104 is configured to operate at a higher voltage level (e.g., 3.3V). In one embodiment, one of the capabilities in the second set is that the removable integrated circuit card 104 is configured to operate at a lower voltage level (e.g., 2.5V). Note that 3.3V and 2.5V are used as examples, and the other voltages could be used.

Card operation 612 is configured to operate the removable integrated circuit card 104 based on the capability set determined by capability determination 610. In one embodiment, card operation 612 selects either a 3.3V power supply 614 or a 2.5V power supply 616 based on the capability set. Card operation 612 controls switch 618 to connect either 3.3V power supply 614 or 2.5V power supply 616 to electrical contact 110c. Electrical contact 110d is connected to ground.

The capability determination 610 and the card operation 612 could be implemented in software, hardware, or a combination of hardware and software. In one embodiment, the capability determination 610 and the card operation 612 are implemented by executing instructions on host processor 116. The instructions may be stored in host memory 118. In one embodiment, the host components in FIG. 6 (e.g., resistive element 604, voltage detector 608, capability determination 610, card operation 612, switch 616, 3.3V power supply 614, and/or 2.5V power supply) are referred to as a control circuit. Any subset of host components in FIG. 6 could be referred to as a control circuit.

FIG. 6a and FIG. 6b provide details how the system of FIG. 6 may be applied for two different removable integrated circuit cards 104. FIG. 6a depicts a removable integrated circuit card 104 having a capability pad 106a-1 that is consistent with the removable integrated circuit cards 104 depicted in FIG. 3a. FIG. 6b depicts a removable integrated circuit card 104 having a capability pad 106a-2 that is consistent with the removable integrated circuit cards 104 depicted in FIG. 3b.

FIG. 6a depicts an example with a relatively long capability pad 106a-1. The capability pad 106a-1 is connected to ground by way of sensing contact 110b. Therefore, Node 606 will be at ground. This corresponds to a logical "0", which may be interpreted as detection of a long capability pad 106a-1. It also may be interpreted as in indication that the removable integrated circuit cards 104 supports "Set 0" of capabilities. The switch 618 may be set in accordance with the detection of a long capability pad 106a-1.

FIG. 6b depicts an example with a relatively short capability pad 106a-2. The capability pad 106a-2 is not connected to ground. Therefore, assuming that there is no voltage drop across resistive element 604 (e.g., resistive element 604 is a resistor with no current flowing through the resistor), Node 606 will be at +V. This condition also may be interpreted as in indication that the removable integrated circuit cards 104 supports "Set 1" of capabilities. The switch 618 may be set in accordance with the detection of a short capability pad 106a-2.

As noted above, an embodiment of the host device 102 in FIG. 6 is able to determine which capability set out of two capability sets are supported by a removable integrated circuit card 104. In some embodiments, the host device 102 is able to determine which capability set out of four possible capability sets is supported by a removable integrated circuit card 104. To do so, the host device 102 is able to distinguish between four different physical configurations of the one or more capability pads 106a. For example, the host device 102 may be able to distinguish between the four different physical configurations depicted in FIGS. 3a to 3d.

FIG. 7 depicts one embodiment of components of a host device 102 that are configured to distinguish between the four different physical configurations of one or more capability pads 106a. The components are further able to determine a capability set from four sets of capabilities based on the four different physical configurations. The components are further able to operate the integrated circuit card 104 based on the determined capability set. In one embodiment, the components are able to distinguish between the four different physical configurations depicted in FIGS. 3a to 3d.

A removable integrated circuit card 104 is depicted in dashed lines in FIG. 7 to indicate a relative location of the removable integrated circuit card 104 to certain components of the host device 102, such as sensing contacts 110a, 110b. An example in which there are two target locations 114a, 114b on the removable integrated circuit card 104 is depicted. There may be more or fewer than two target locations 114 on the removable integrated circuit card 104. The one or more capability pads 106a are not expressly depicted in FIG. 7. FIGS. 7a to 7d depict four different physical configurations for the one or more capability pads 106a. In one embodiment, the one or more capability pads 106a are internally connected to ground when the host device 102 senses the capability pads 106a.

The host device 102 provides voltage (+V) to Node 702a, which is connected to one end of first resistive element 704a. In one embodiment, first resistive element 704a includes a resistor. The other end of first resistive element 704a is connected to Node 706a, which is connected to sensing contact 110a.

The host device 102 provides voltage (+V) to Node 702b, which is connected to one end of second resistive element 704b. In one embodiment, second resistive element 704b includes a resistor. The other end of second resistive element 704b is connected to Node 706b, which is connected to sensing contact 110b.

First resistive element 704a could be any resistive element that can absorb the voltage difference between Node 702a and Node 706a when Node 706a is grounded. For example, if Node 706a is at ground the voltage across the first resistive element 704a will be +V. Likewise, second resistive element 704b could be any resistive element that can absorb the voltage difference between Node 702a and Node 706b when Node 706b is grounded.

In one embodiment, the removable integrated circuit card 104 is not powered on when the host device 102 senses the physical configuration of the one or more capability pads. However, the one or more capability pads 106a are internally connected to ground when the host device 102 senses the capability pad 106a. In one embodiment, the removable integrated circuit card 104 connects the capability pad 106a to a ground that is supplied on capability pad 106a (see, for example, electrical contact 110d).

Voltage detector 708a is configured to sense a voltage at Node 706a. Likewise, voltage detector 708b is configured to sense a voltage at Node 706b. In one embodiment, voltage detector 708a, voltage detector 708b, first resistive element 704a, and second resistive element 704b are part of the sensing circuit 112. Capability determination 710 determines the capability set based on a first signal from voltage detector 708a and a second signal from voltage detector 708b. Card operation 712 operates the removable integrated circuit card 104 in accordance with the capability set. Card operation 712 controls switch 714 to select either the 3.3V power supply 716 or the 2.5V power supply 718.

The capability determination 710 and the card operation 712 could be implemented in software, hardware, or a combination of hardware and software. In one embodiment, the capability determination 710 and the card operation 712 are implemented by executing instructions on host processor 116. The instructions may be stored in host memory 118. In one embodiment, the host components in FIG. 7 (e.g., resistive elements 704a, 704b, voltage detectors 708a, 708b, capability determination 710, card operation 712, switch 714, 3.3V power supply 716, and/or 2.5V power supply 718) are referred to as a control circuit. Any subset of host components in FIG. 7 could be referred to as a control circuit.

Figure 7A:
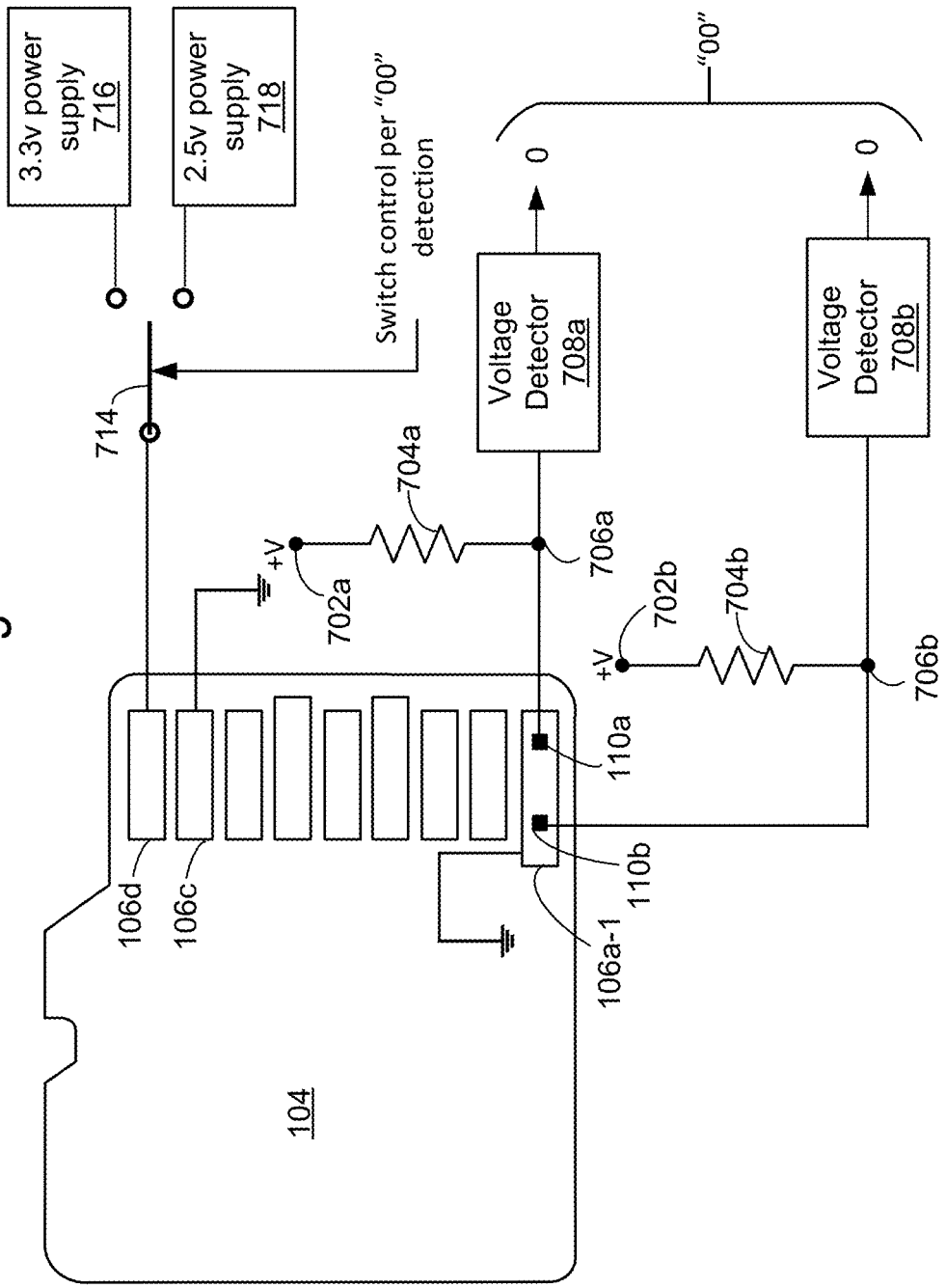
FIGS. 7a, 7b, 7c, and 7d provide details of how one embodiment of the system of FIG. 7 may be applied for four different physical configurations of capability pads.

FIG. 7a will now be discussed in order to illustrate sensing of capability pad 106a-1. As noted in the discussion of FIG. 7, host device 102 provides voltage (+V) to Node 702a, which is connected to one end of first resistive element 704a. The other end of first resistive element 704a is connected to Node 706a, which is connected to sensing contact 110a. Also, host device 102 provides voltage (+V) to Node 702b, which is connected to one end of second resistive element 704b. The other end of second resistive element 704b is connected to Node 706b, which is connected to sensing contact 110b. The external surface of capability pad 106a-1 is electrically connected to both sensing contacts 110a, 110b.

The capability pad 106a-1 is internally grounded. By this it is meant that the pathway to ground is provided within integrated circuit card 104. In other words, the host device 102 does not apply ground directly to the external surface of the capability pad 106a-1. However, the host device may supply ground to electrical contact 110d. There may be an electrical connection within the integrated circuit card 104 between the capability pad 106a-1 and electrical contact 110d in order to ground the capability pad 106a-1.

Given that capability pad 106a-1 is internally grounded, Node 706a will be at ground. Also, given that capability pad 106a-1 is internally grounded, Node 706b will also be at ground. For purpose of discussion, a ground will be interpreted as a logic low or as "0." Thus, voltage detector 708a outputs a "0". Likewise, voltage detector 708b outputs a "0".

Returning again to the discussion of FIG. 7, the voltage detectors 708a, 708b provide their respective outputs to the capability determination 710. In this example, the "00" is interpreted by the capability determination 710 as a "long pad". Moreover, the "00" indicates which of the four different sets of capabilities the integrated circuit card 104 has. Capability determination 710 informs card operation 712 which capability set the integrated circuit card 104 has. Card operation 712 controls switch 714 based on the "00" detection. In other words, card operation 712 controls switch 714 based on the determined capability set.

Figure 7B:
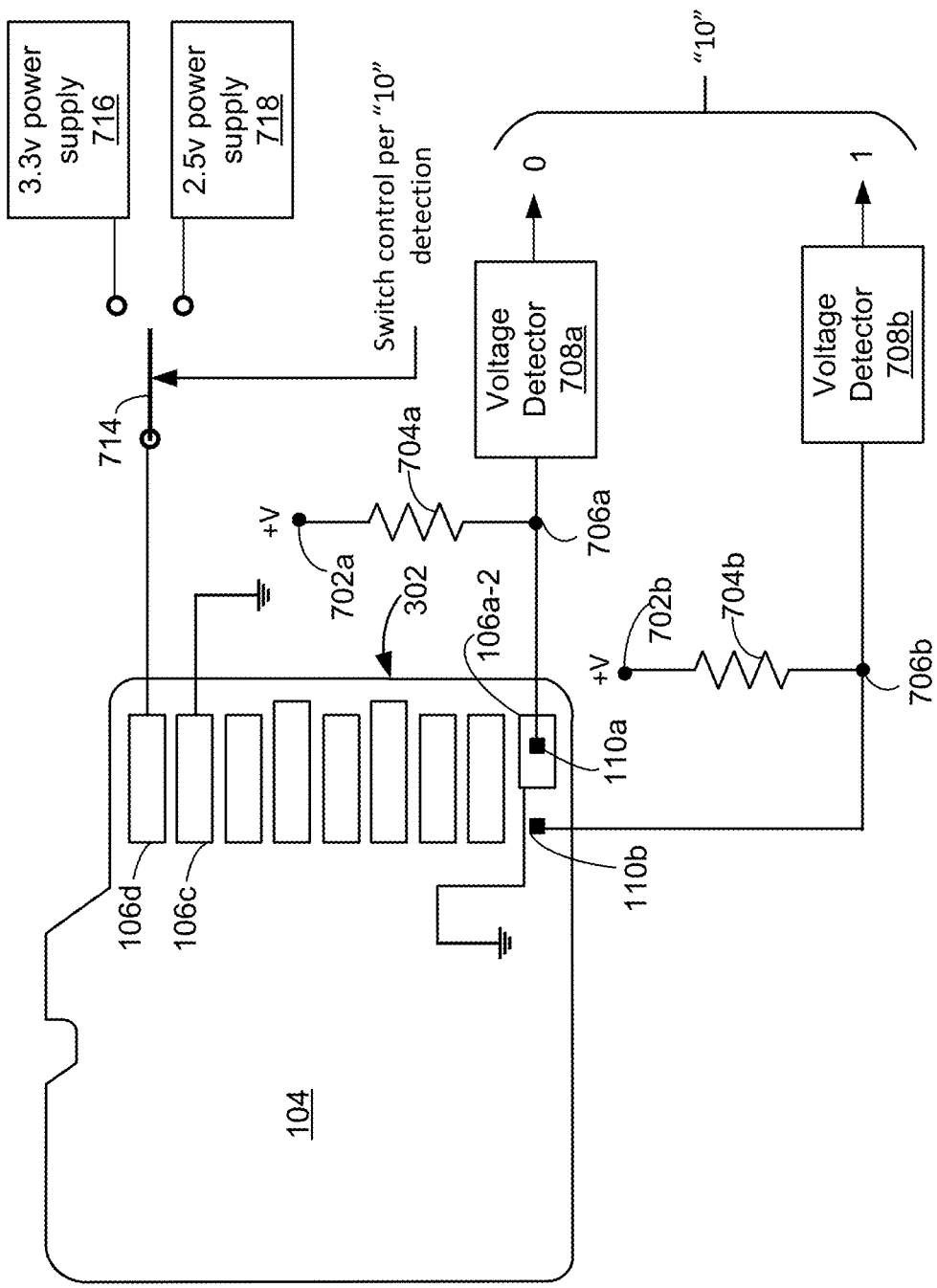

FIG. 7b will now be discussed in order to illustrate sensing of capability pad 106a-2. As noted in the discussion of FIG. 7, host device 102 provides voltage (+V) to Node 702a, which is connected to one end of first resistive element 704a. The other end of first resistive element 704a is connected to Node 706a, which is connected to sensing contact 110a. Also, host device 102 provides voltage (+V) to Node 702b, which is connected to one end of second resistive element 704b. The other end of second resistive element 704b is connected to Node 706b, which is connected to sensing contact 110b. In this example, the external surface of capability pad 106a-2 is electrically connected to sensing contact 110a. However, the external surface of capability pad 106a-2 is not electrically connected to sensing contact 110b, due to the relatively short length of capability pad 106a-2.

As with the example of FIG. 7A, the capability pad 106a-2 in FIG. 7B is internally grounded. By this it is meant that the pathway to ground is provided within integrated circuit card 104. In other words, the host device 102 does not apply ground directly to the external surface of the capability pad 106a-2. However, the host device may supply ground to electrical contact 110d. There may be an electrical connection within the integrated circuit card 104 between the capability pad 106a-2 and electrical contact 110d in order to ground the capability pad 106a-2.

Given that capability pad 106a-2 is internally grounded, Node 706a will be at ground. However, Node 706b will not be at ground. Instead the voltage at Node 706b will be +V minus the voltage drop across resistive element 704b. Assuming that there is no voltage drop across second resistive element 704b, the voltage at Node 706b will be +V. Thus, voltage detector 708a outputs a "0". On the other hand, voltage detector 708b outputs a "1".

Returning again to the discussion of FIG. 7, the voltage detectors 708a, 708b provide their respective outputs to the capability determination 710. In this example, the "10" is interpreted by the capability determination 710 as a "short pad near the front edge 302". Moreover, the "10" indicates which of the four different sets of capabilities the integrated circuit card 104 has. Capability determination 710 informs card operation 712 which capability set the integrated circuit card 104 has. Card operation 712 controls switch 714 based on the "10" detection. In other words, card operation 712 controls switch 714 based on the determined capability set.

Figure 7C:
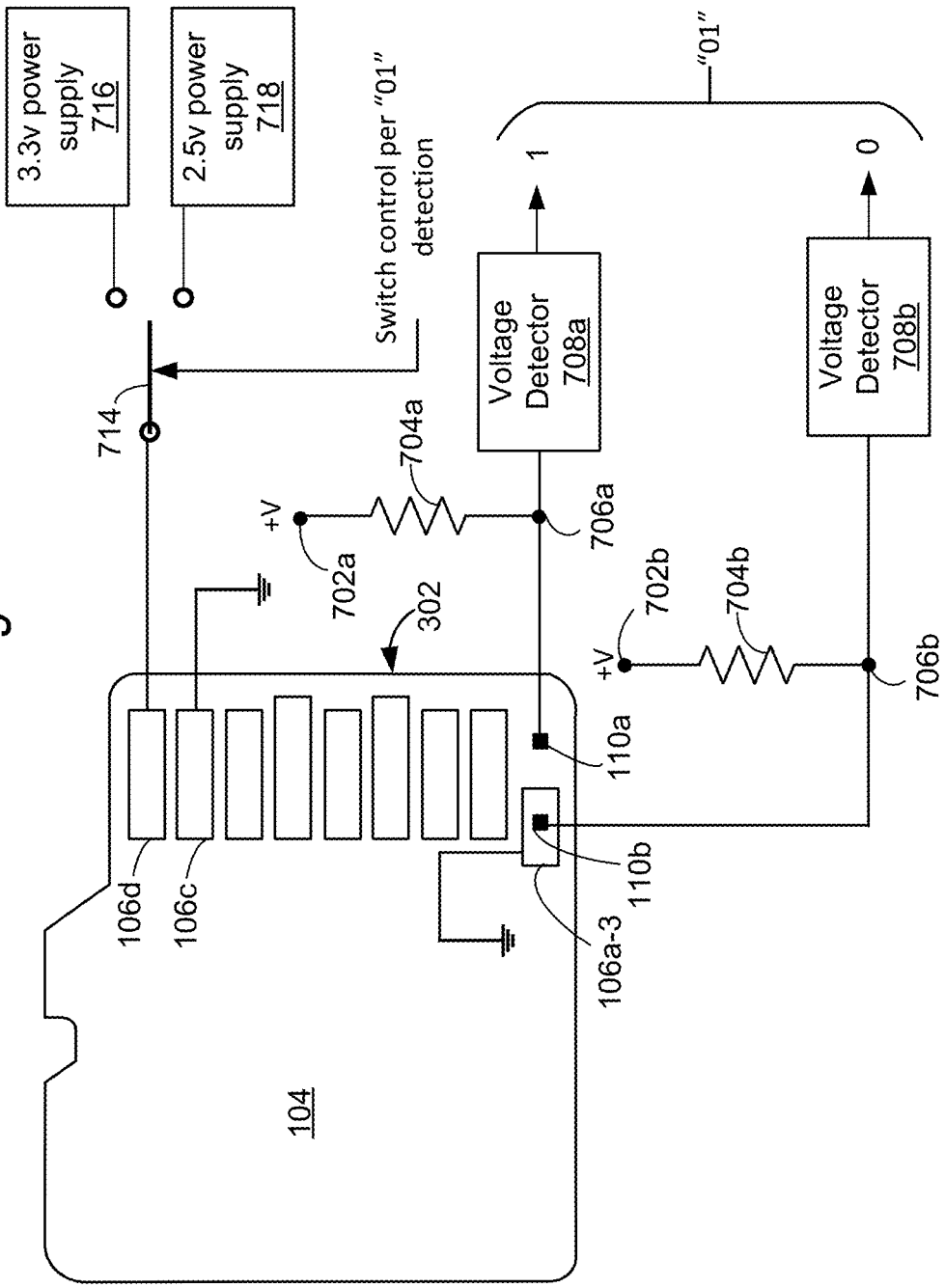

FIG. 7c will now be discussed in order to illustrate sensing of capability pad 106a-3. As noted in the discussion of FIG. 7, host device 102 provides voltage (+V) to Node 702a, which is connected to one end of first resistive element 704a. The other end of first resistive element 704a is connected to Node 706a, which is connected to sensing contact 110a. Also, host device 102 provides voltage (+V) to Node 702b, which is connected to one end of second resistive element 704b. The other end of second resistive element 704b is connected to Node 706b, which is connected to sensing contact 110b. In this example, the external surface of capability pad 106a-3 is electrically connected to sensing contact 110b. However, the external surface of capability pad 106a-3 is not electrically connected to sensing contact 110a, due to the relatively short length of capability pad 106a-3 as well as the physical location of capability pad 106a-3.

As with the examples of FIGS. 7A and 7B, the capability pad 106a-3 in FIG. 7C is internally grounded. By this it is meant that the pathway to ground is provided within integrated circuit card 104. In other words, the host device 102 does not apply ground directly to the external surface of the capability pad 106a-3. However, the host device may supply ground to electrical contact 110d. There may be an electrical connection within the integrated circuit card 104 between the capability pad 106a-3 and electrical contact 110d in order to ground the capability pad 106a-3.

Given that capability pad 106a-3 is internally grounded, Node 706b will be at ground. However, Node 706a will not be at ground. Instead the voltage at Node 706a will be +V minus the voltage drop across first resistive element 704a. Assuming that there is no voltage drop across first resistive element 704a, the voltage at Node 706a will be +V. Thus, voltage detector 708a outputs a"1". On the other hand, voltage detector 708b outputs a "0".

Returning again to the discussion of FIG. 7, the voltage detectors 708a, 708b provide their respective outputs to the capability determination 710. In this example, the "01" is interpreted by the capability determination 710 as a "short pad away from the front edge 302". Moreover, the "01" indicates which of the four different sets of capabilities the integrated circuit card 104 has. Capability determination 710 informs card operation 712 which capability set the integrated circuit card 104 has. Card operation 712 controls switch 714 based on the "01" detection. In other words, card operation 712 controls switch 714 based on the determined capability set.

Figure 7D:
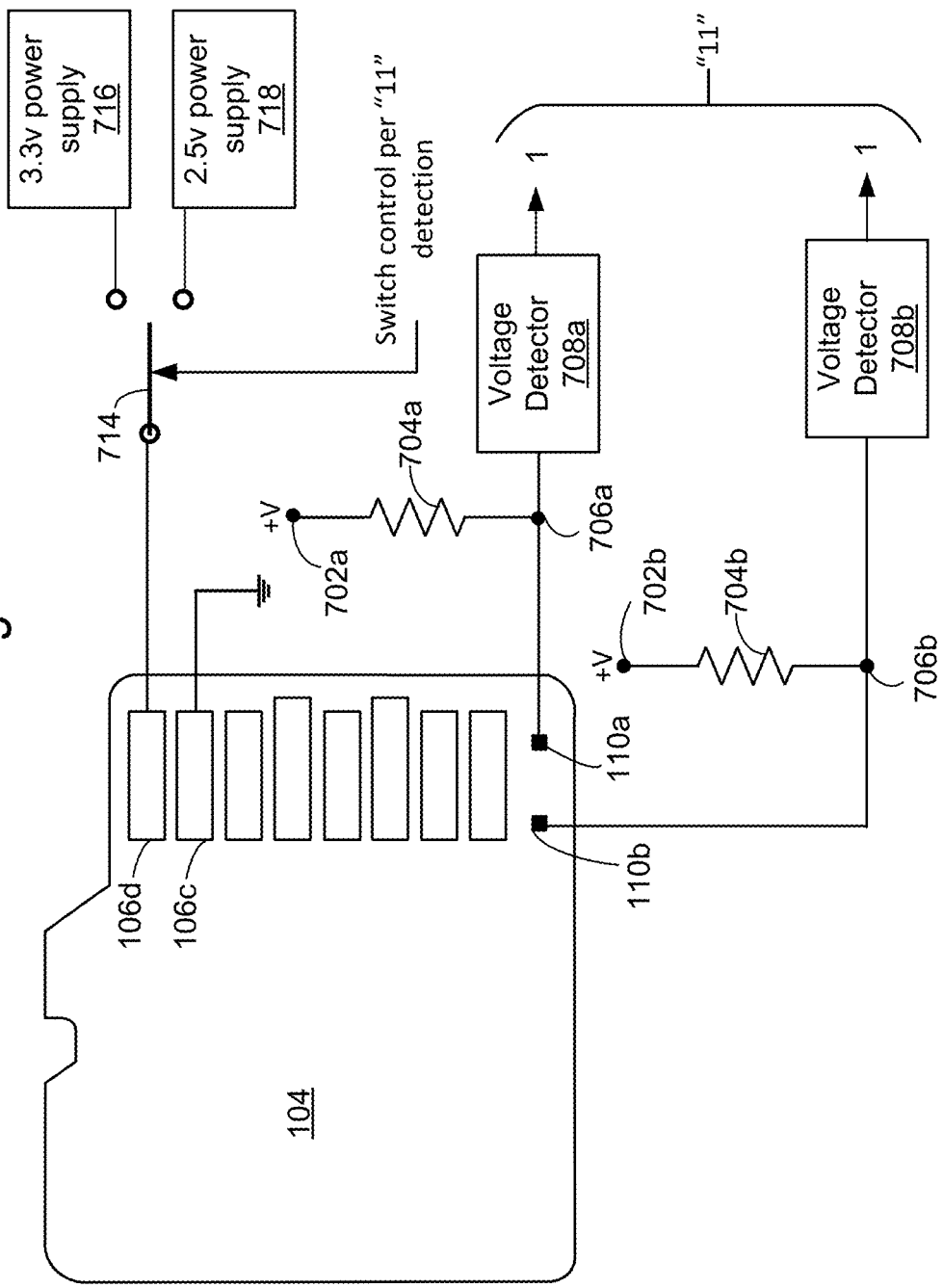

FIG. 7d will now be discussed in order to illustrate a case in which the integrated circuit card 104 does not have a capability pad. As noted in the discussion of FIG. 7, host device 102 provides voltage (+V) to Node 702a, which is connected to one end of first resistive element 704a. The other end of first resistive element 704a is connected to Node 706a, which is connected to sensing contact 110a. Also, host device 102 provides voltage (+V) to Node 702b, which is connected to one end of second resistive element 704b. The other end of second resistive element 704b is connected to Node 706b, which is connected to sensing contact 110b. In this example, since there is not capability pad (at least to make contact with sensing contacts 110a, 110*b*) neither Node 706*a* or Node 706*b* is grounded. The voltage at Node 706*a* will be +V minus the voltage drop across first resistive element 704*a*. Assuming that there is no voltage drop across first resistive element 704*a*, the voltage at Node 706*a* will be +V. Thus, voltage detector 708*a* outputs a "1". Likewise, the voltage at Node 706*b* will be +V minus the voltage drop across second resistive element 704*b*. Assuming that there is no current flowing in second resistive element 704*b*, the voltage at Node 706*b* will be +V. Thus, voltage detector 708*b* outputs a "1".

Returning again to the discussion of FIG. 7, the voltage detectors 708*a*, 708*b* provide their respective outputs to the capability determination 710. In this example, the "11" is interpreted by the capability determination 710 as a "short pad away from the front edge 302". Moreover, the "11" indicates which of the four different sets of capabilities the integrated circuit card 104 has. Capability determination 710 informs card operation 712 which capability set the integrated circuit card 104 has. Card operation 712 controls switch 714 based on the "11" detection. In other words, card operation 712 controls switch 714 based on the determined capability set.

Figure 8:
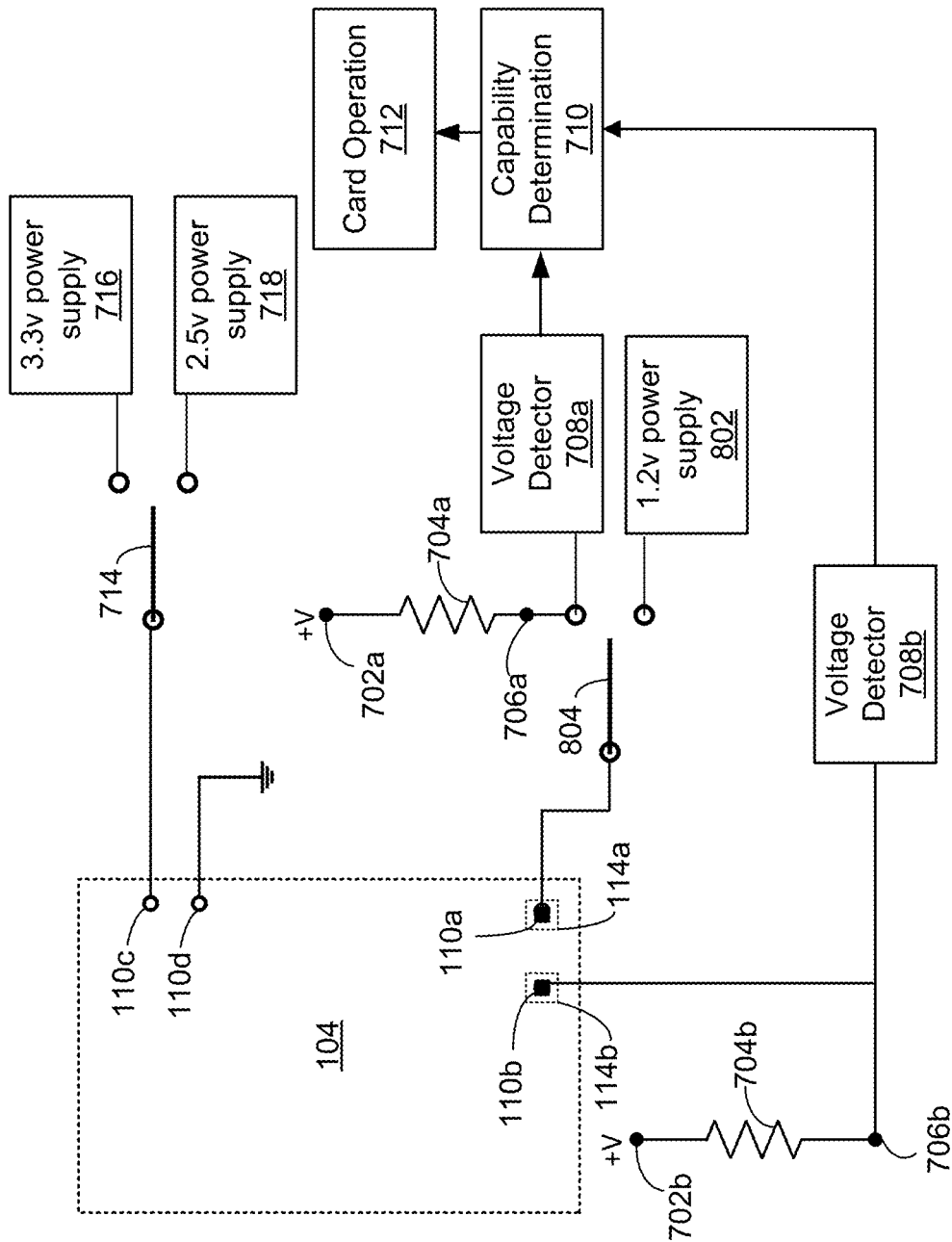
FIG. 8 depicts one embodiment of a system in which a capability pad is used to provide power to the removable integrated circuit card during operation.

In some embodiments, a capability pad 106*a* may serve an additional function while the removable integrated circuit card 104 is being operated. For example, the capability pad 106*a* may be used as an interface pad to supply a voltage to the removable integrated circuit card 104 during operation. FIG. 8 depicts one embodiment of a system in which a capability pad 106*a* is used to provide power to the removable integrated circuit card 104 during operation.

The system of FIG. 8 is similar to the system in FIG. 7, but adds a 1.2v power supply 802 and a switch 804. The switch 804 may be used to connect sensing contact 110*a* to the voltage detector 708*a* when the capability of the removable integrated circuit card 104 is being determined. If the host device 102 determines that the removable integrated circuit card 104 is configured to operate using the 1.2V power supply 802, then switch 804 is connected to the 1.2V power supply 802. Therefore, the 1.2V power supply 802 is connected to the sensing contact 110*a*. Therefore, the 1.2V power supply 802 is connected to a capability pad 106*a* (capability pad not depicted in FIG. 8) during operation of the removable integrated circuit card 104. On the other hand, if the host device 102 determines that the removable integrated circuit card 104 is not configured to operate using the 1.2V power supply 802, then the switch 804 is not connected to the 1.2V power supply 802 during operation of the removable integrated circuit card 104. Note that 1.2V is used as an example and that other voltages could be used instead of 1.2V. In one embodiment in which a capability pad 102*a* is used to provide a voltage during operation, the existence of the capability pad indicates that the removable integrated circuit card 104 supports operating at the voltage. The existence of the capability pad can be determined using various techniques disclosed herein.

In one embodiment, even if the 1.2V power supply 802 is connected to a capability pad 106*a*, either the 3.3V power supply 716 or the 2.5V power supply 718 can be connected to interface pad 106*d* (see electrical contact 110*c*). Thus, the removable integrated circuit card 104 could be provided with more than one power supply.

In one embodiment, the host components in FIG. 8 (e.g., resistive elements 704*a*, 704*b*, voltage detectors 708*a*, 708*b*, capability determination 710, card operation 712, switch 714, 3.3V power supply 716, 2.5V power supply 718, and/or 1.2V power supply 802, and/or switch 804) are referred to as a control circuit. Any subset of host components in FIG. 8 could be referred to as a control circuit.

The concept depicted in FIG. 8 can be extended to use the capability pad 106*a* for functions other than receiving a power supply during operation. In one embodiment, instead of connecting 1.2V power supply 802 to the sensing contact 110*a* (and hence to a capability pad 106*a*), sensing contact 110*a* is connected to a ground during operation of the removable integrated circuit card 104. In one embodiment, instead of connecting 1.2V power supply 802 to the sensing contact 110*a* (and hence to a capability pad 106*a*), sensing contact 110*a* is connected to a driver in the host device 102 that provides a signal over a data line during operation. Hence, the capability pad 106*a* could have a dual use of indicating a capability set and transferring data during operation under the capability set. In one embodiment, instead of connecting 1.2V power supply 802 to the sensing contact 110*a* (and hence to a capability pad 106*a*), sensing contact 110*a* is connected to a clock circuit that provides a clock signal during operation. Hence, the capability pad 106*a* could have a dual use of indicating a capability set and receiving a clock signal during operation.

Figure 9:
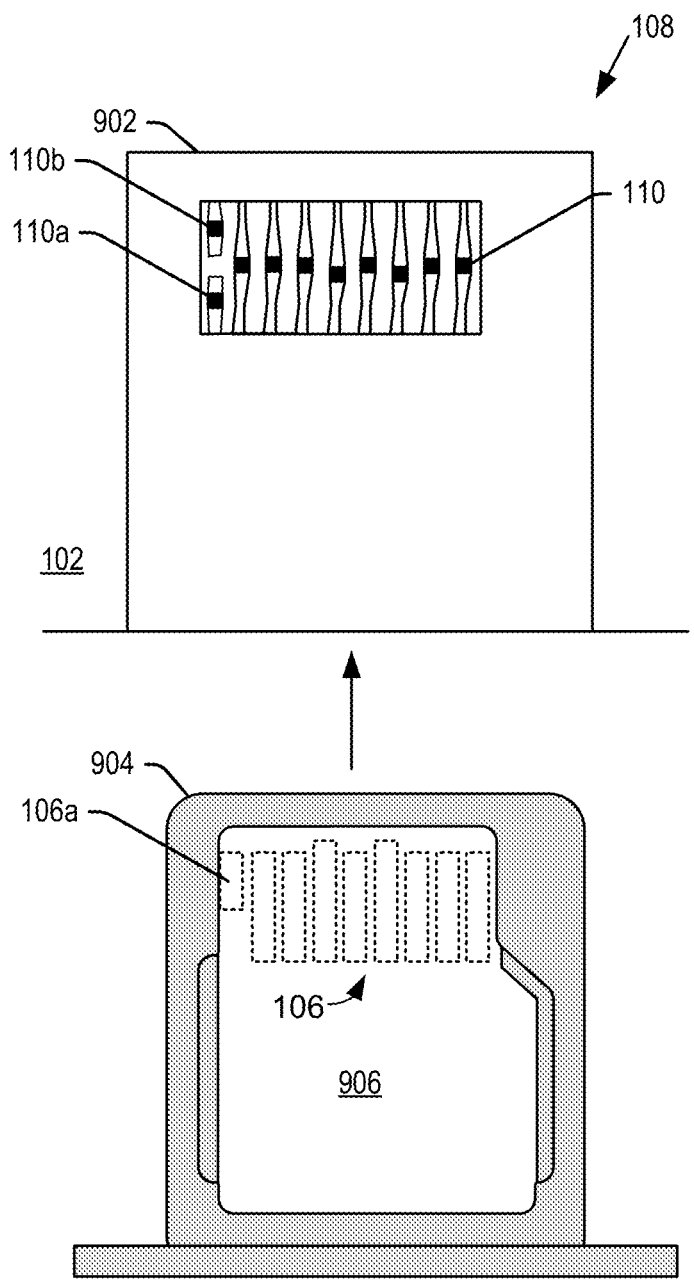
FIG. 9 depicts one embodiment of a card connector.

Recall that FIG. 1 shows that the host device 102 may have a card connector 108 that is configured to receive the removable integrated circuit card 104. FIG. 9 depicts further details of one embodiment of a card connector 108. FIG. 9 shows a cross-sectional top view of a card connector 108 within a slot 902 in a host device 102 for receiving a tray 904. The tray 904 has an opening 906 that is configured to hold a removable integrated circuit card 104. Dashed rectangles in the opening 906 represent possible locations for the interface pads 106 of the removable integrated circuit card 104. The card connector 108 is configured to receive the tray 904. The card connector 108 in slot 902 may comprise a number of electrical contacts 110. The electrical contacts 110 are configured to mate with the interface pads 106 of the removable integrated circuit card 104. Two of the electrical contacts 110 serve as sensing contacts 110*a*, 110*b*, which may be used to detect a physical condition of one or more capability pads 106*a*. There may be more or fewer than two sensing contacts.

Figure 10:
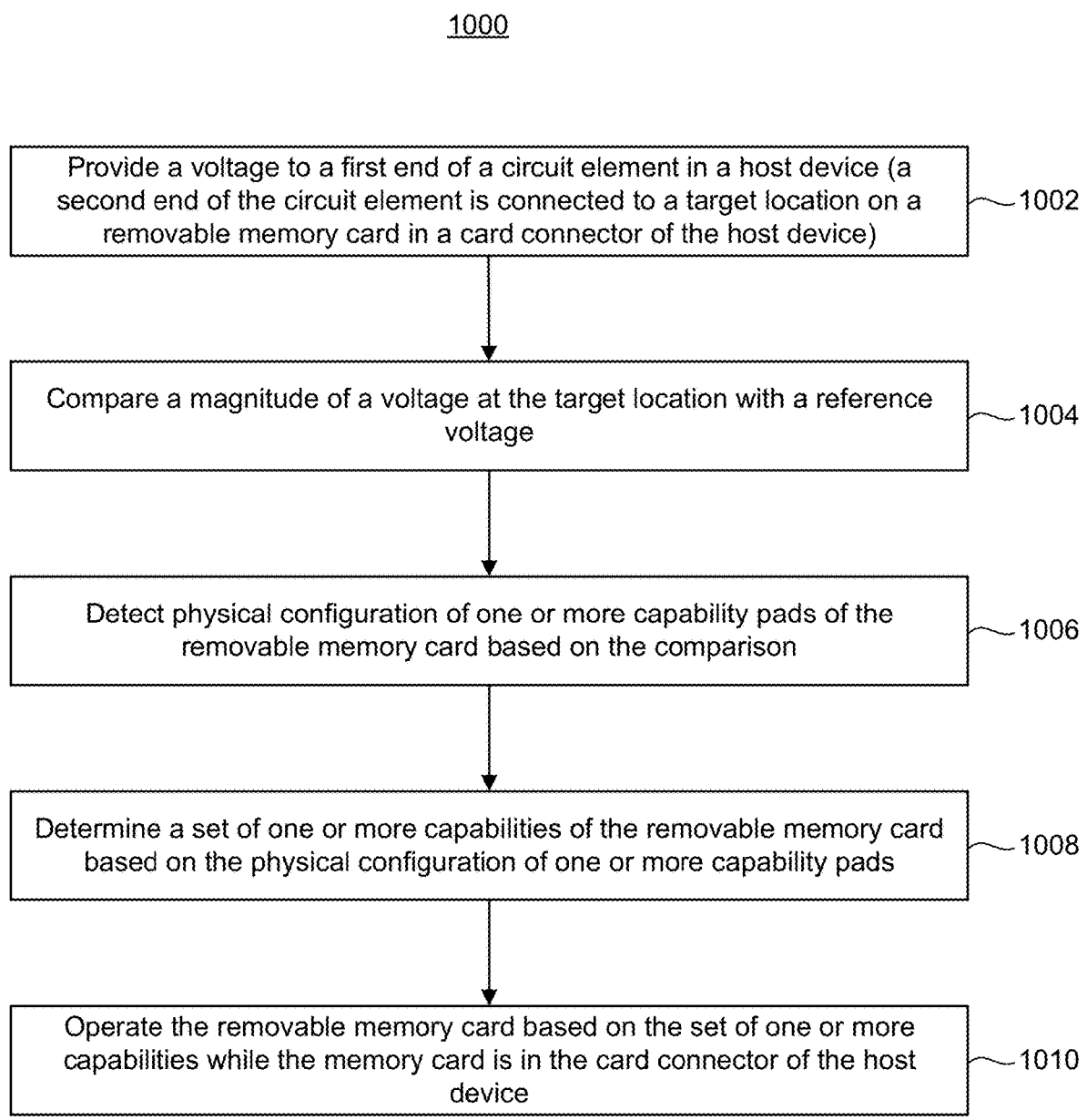
FIG. 10 depicts a flowchart of one embodiment a process of operating a removable memory card.

In some embodiments, the removable integrated circuit card 104 is a removable memory card. FIG. 10 depicts a flowchart of one embodiment a process 1000 of operating a removable memory card. The process 1000 may be performed by one or more control circuits. The one or more control circuits may be implemented in software, hardware, or a combination of hardware and software. In one embodiment, the one or more control circuits include sensing circuit 112, host processor 116 and host memory 118. Process 1000 could be performed by one or more host components in FIG. 6, FIG. 7, or FIG. 8, but is not limited thereto.

Step 1002 includes providing a voltage to a first end of a resistive element in a host device 102. In one embodiment, step 1002 is performed by sensing circuit 112. In one embodiment, with reference to FIG. 6, +V is provided to Node 602, wherein the voltage is provided to a first end of resistive element 604. In one embodiment, with reference to FIG. 7, +V is provided to Node 702*a*, wherein the voltage is provided to a first end of first resistive element 704*a*. Note that in one embodiment, +V is provided to Node 702*b*, wherein the voltage is provided to a first end of second resistive element 704*b*.

A second end of the resistive element is connected to a target location 114 on a removable memory card 104 in a card connector 108 of the host device 102. Note that this connection could occur as a result of the removable memory card being inserted into the card connector 108. Alternatively, the host device 102 could take an action (such as closing a switch) to connect the second end of the resistive element is to the target location 114. In one embodiment, with reference to FIG. 6, the end of resistive element 604 at node 606 is connected to sensing contact 110a. Sensing contact 110a is connected to target location 114a. In one embodiment, with reference to FIG. 7, the end of resistive element 704a at node 706a is connected to sensing contact 110a. Sensing contact 110a is connected to target location 114a.

Step 1004 includes comparing a magnitude of a voltage at the target location with a reference voltage. In one embodiment, step 1004 is performed by sensing circuit 112. With reference to FIG. 6, the voltage detector 608 may compare the voltage at sensing contact 110a with a reference voltage. Note that in one embodiment, the host device 102 connects target location 114b to ground in step 1002, such that target location 114b is grounded when voltage detector 608 senses target location 114a. With reference to FIG. 7, the voltage detector 708a may compare the voltage at sensing contact 110a with a reference voltage. Note that in one embodiment, +V is provided to Node 702b. Thus, +V may be provided to both Node 702a and Node 702b when the voltage detector 608 senses target location 114a.

Step 1006 includes detecting a physical configuration of one or more capability pads of the removable memory card based on the comparison. In one embodiment, step 1006 is performed by host processor 116. Any of the physical configurations depicted in FIG. 3a, 3b, 3c, 3d, or 4 could be detected, as well as other physical configurations. Note that step 1006 may be based on additional information than the comparison of step 1004. In one embodiment, step 1006 is based on multiple such comparisons. For example, step 1006 can be based on a comparison performed by voltage detector 708a and a comparison performed by voltage detector 708b.

Step 1008 includes determining a capability set of the removable memory card based on the physical configuration of one or more capability pads. In one embodiment, step 1008 is performed by host processor 116. For example, the physical configuration of capability pad 106a-1 may indicate one capability set and the physical configuration of capability pad 106a-2 may indicate another capability set. As another example, the four different physical configurations depicted in FIGS. 3a to 3d may indicate one of four different sets of capabilities.

Step 1010 includes operating the removable memory card based on the capability set while the removable memory card is in the card connector 108 of the host device 102. In one embodiment, step 1010 is performed by host processor 116. In one embodiment, step 1010 includes providing a voltage to a power supply interface pad of the removable memory card, wherein a magnitude of the power supply voltage depends on the determined capability set of the removable memory card.

Figure 11:
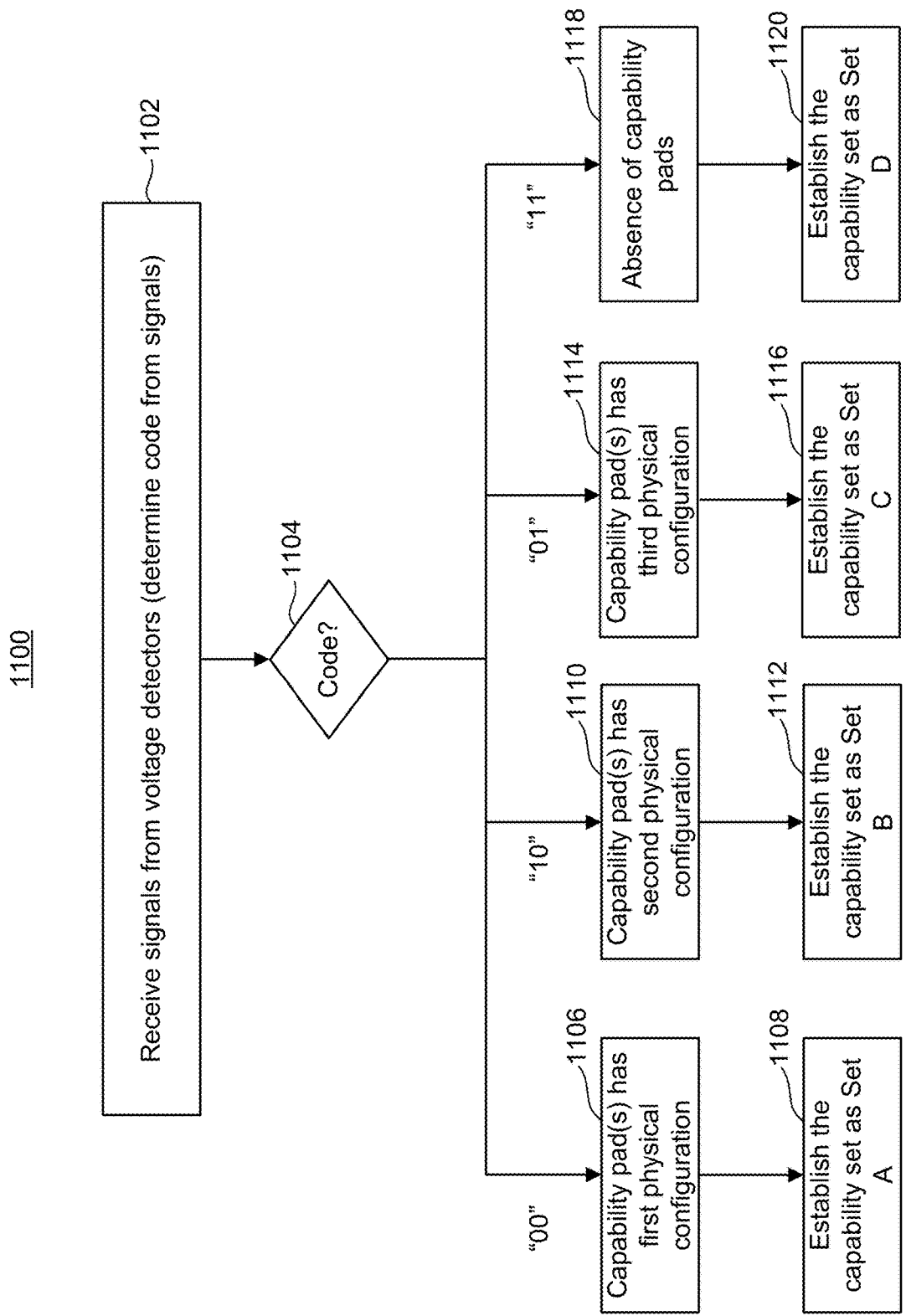
FIG. 11 depicts a flowchart of one embodiment a process of determining a capability set of a removable memory card.

FIG. 11 depicts a flowchart of one embodiment a process 1100 of determining a capability set of a removable integrated circuit card 104, such as a removable memory card. The process 1100 will be discussed with reference to FIG. 8, but is not limited thereto. In one embodiment, process 1100 is performed by capability determination 710. Process 1100 describes some example capabilities for Set A, Set B, Set C, and Set D. The capability sets are not limited to these examples. Process 1100 describes further details of one embodiment of step 1008 of process 1000. Process 1100 describes further details of one embodiment of step 206 of process 200.

Step 1102 includes receiving signals from voltage detectors. In one embodiment, capability determination 710 receives a first signal from voltage detector 708a and a second signal from voltage detector 708b. Step 1102 may also include determining a binary code from the signals. In an embodiment that is consistent with FIG. 8, the binary code is two bits. The binary code could have more or fewer than two bits. In an embodiment that is consistent with FIG. 6, the binary code is one bit. If the host device 102 is configured to detect voltages at three target locations on the removable integrated circuit card 104 the binary code could have three bits.

Step 1104 includes a decision of which branch to take based on the code. If the binary code is "00", then control passes to step 1106. Step 1106 includes a determination that the one or more capability pads has a first physical configuration. In one embodiment, the first physical configuration is the relatively long capability pad 106a-1 depicted in FIG. 3a.

Step 1108 includes establishing the capability set as Set A. Step 1108 may include storing the binary code in memory. The memory could be volatile or memory non-volatile memory. In one embodiment, the binary code is stored in host memory 118. In one embodiment, Set A includes the capability to operate at a low voltage (e.g., 2.5V). Set A could also include capabilities such as the capability to operate with a second voltage (e.g., 1.2V), which would be provided to a different interface pad than the aforementioned low voltage.

If the binary code is "10", then control passes to step 1110. Step 1110 includes a determination that the one or more capability pads has a second physical configuration. In one embodiment, the second physical configuration is the relatively short capability pad 106a-2 that is close to the front edge 302 of the removable integrated circuit card 104, as depicted in FIG. 3b.

Step 1112 includes establishing the capability set as Set B. Step 1112 may include storing the binary code in memory. The memory could be volatile or memory non-volatile memory. In one embodiment, the binary code is stored in host memory 118. In one embodiment, Set B includes the capability to operate at a high voltage (e.g., 3.5V). In one embodiment, Set B does not include the capability to operate with a second voltage (e.g., 1.2V), as was the case of Set A.

If the binary code is "01", then control passes to step 1114. Step 1114 includes a determination that the one or more capability pads has a third physical configuration. In one embodiment, the third physical configuration is the relatively short capability pad 106a-3 that is away to the front edge 302 of the removable integrated circuit card 104, as depicted in FIG. 3c.

Step 1116 includes establishing the capability set as Set C. Step 1116 may include storing the binary code in memory. The memory could be volatile or memory non-volatile memory. In one embodiment, the binary code is stored in host memory 118. In one embodiment, Set C includes the capability to operate at a low voltage (e.g., 2.5V). In one embodiment, Set C does not include the capability to operate with a second voltage (e.g., 1.2V), as was the case of Set A.

If the binary code is "11", then control passes to step 1118. Step 1118 includes a determination that there are not any capability pads on the removable integrated circuit card 104. FIG. 3d depicts an example of a removable integrated circuit card 104 without a capability pad (note that there is not an interface pad at either target location 114a, 114b).

Step 1120 includes establishing the capability set as Set D. Step 1120 may include storing the binary code in memory.

The memory could be volatile or memory non-volatile memory. In one embodiment, the binary code is stored in host memory 118. In one embodiment, Set D includes the capability to operate at a high voltage (e.g., 3.3). Set D could also include capabilities such as the capability to operate with a second voltage (e.g., 1.2V), which would be provided to a different interface pad than the aforementioned high voltage.

Figure 12:
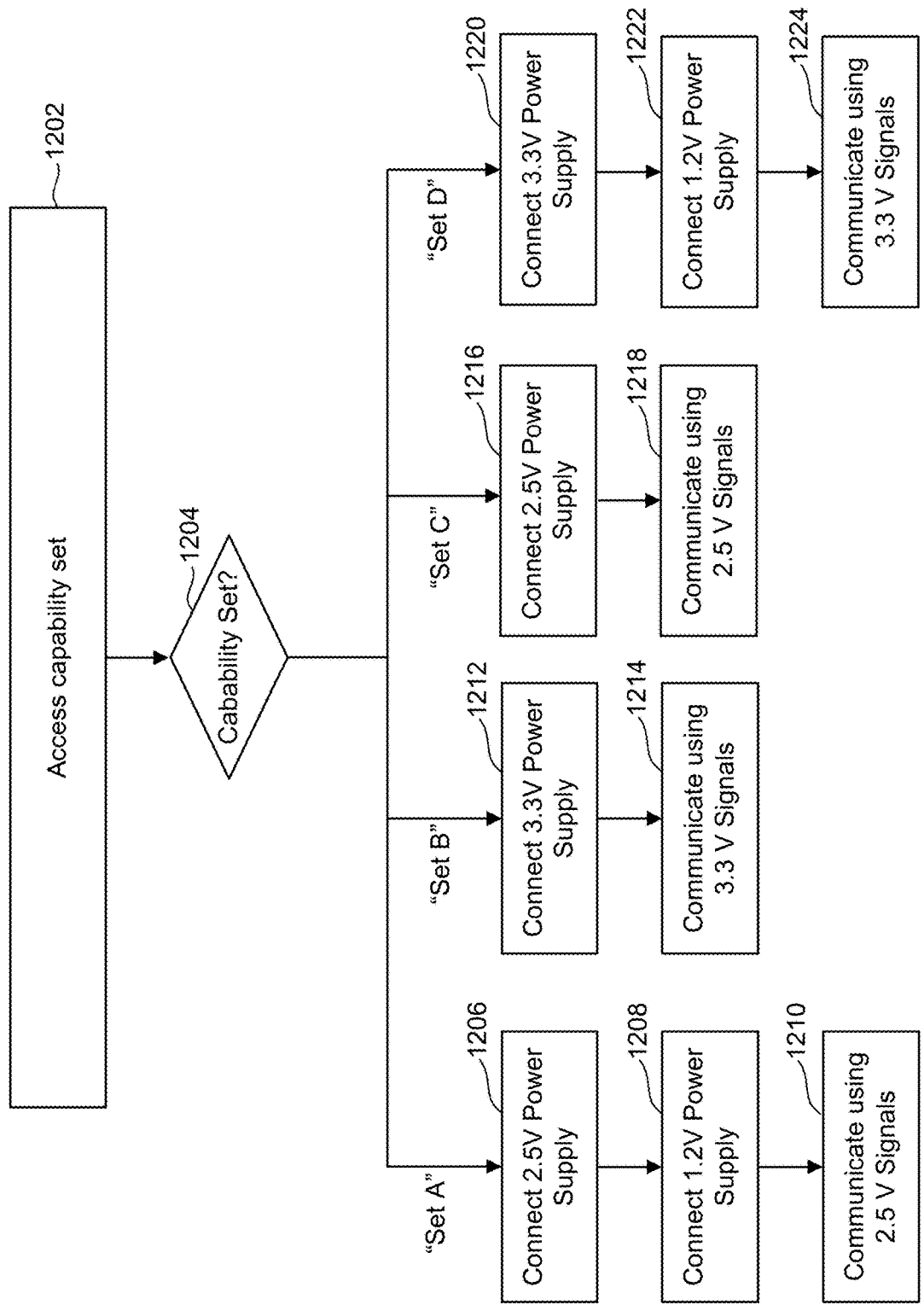
FIG. 12 depicts a flowchart of one embodiment a process of operating a removable memory card based on a capability set of the removable memory card.

FIG. 12 depicts a flowchart of one embodiment a process 1200 of operating a removable memory card based on a capability set of the removable memory card. In one embodiment, process 1200 is performed in combination with process 1100. However, process 1200 is not limited to being performed in combination with process 1100. The process 1200 will be discussed with reference to FIG. 8, but is not limited thereto. In one embodiment, process 1200 is performed by card operation 712. Process 1200 describes some example capabilities for Set A, Set B, Set C, and Set D. The capability sets are not limited to these examples. Process 1200 describes further details of one embodiment of step 1010 of process 1000. Process 1200 describes further details of one embodiment of step 208 of process 200.

Step 1202 includes accessing a capability set for the removable integrated circuit card 104. In one embodiment, the binary code that was stored in host memory 118 in process 1100 is accessed. The binary code indicates the capability set, as was discussed in process 1100. For example, "00" may correspond to Set A, "10" may correspond to Set B, "01" may correspond to Set C, and "11" may correspond to Set D. As was discussed in process 1100, the binary code may have more or fewer than two bits.

Step 1204 includes a decision of which branch to take based on the capability set. If the capability set is "Set A", then control passes to step 1206. Step 1206 includes connecting the removable integrated circuit card 104 to a 2.5V power supply. In one embodiment, switch 714 is connected to the 2.5V power supply 718. Step 1208 includes connecting the removable integrated circuit card 104 to a 1.2V power supply. In one embodiment, switch 804 is connected to the 1.2V power supply 802. Step 1210 includes communicating with the removable integrated circuit card 104 using 2.5V signals. This communication takes place over one or more interface pads 106.

If the capability set is "Set B", then control passes to step 1212. Step 1212 includes connecting the removable integrated circuit card 104 to a 3.3V power supply. In one embodiment, switch 714 is connected to the 3.3V power supply 716. Step 1214 includes communicating with the removable integrated circuit card 104 using 3.3V signals. This communication takes place over one or more interface pads 106.

If the capability set is "Set C", then control passes to step 1216. Step 1216 includes connecting the removable integrated circuit card 104 to a 2.5V power supply. In one embodiment, switch 714 is connected to the 2.5V power supply 718. Step 1218 includes communicating with the removable integrated circuit card 104 using 2.5V signals. This communication takes place over one or more interface pads 106.

If the capability set is "Set D", then control passes to step 1220. Step 1220 includes connecting the removable integrated circuit card 104 to a 3.3V power supply. In one embodiment, switch 714 is connected to the 3.3V power supply 716. Step 1222 includes connecting the removable integrated circuit card 104 to a 1.2V power supply. In one embodiment, switch 804 is connected to the 1.2V power supply 802. Step 1224 includes communicating with the removable integrated circuit card 104 using 3.3V signals. This communication takes place over one or more interface pads 106.

In some embodiments, in order to sense the physical condition of the one or more capability pads 106a, the host device 102 provides two or more voltages to the removable integrated circuit card 104. The removable integrated circuit card 104 routes at least one of the received voltages to at least one capability pad 106a in order to indicate the capability set. An example of this was described above in connection with FIGS. 5a-5d.

Figure 13:
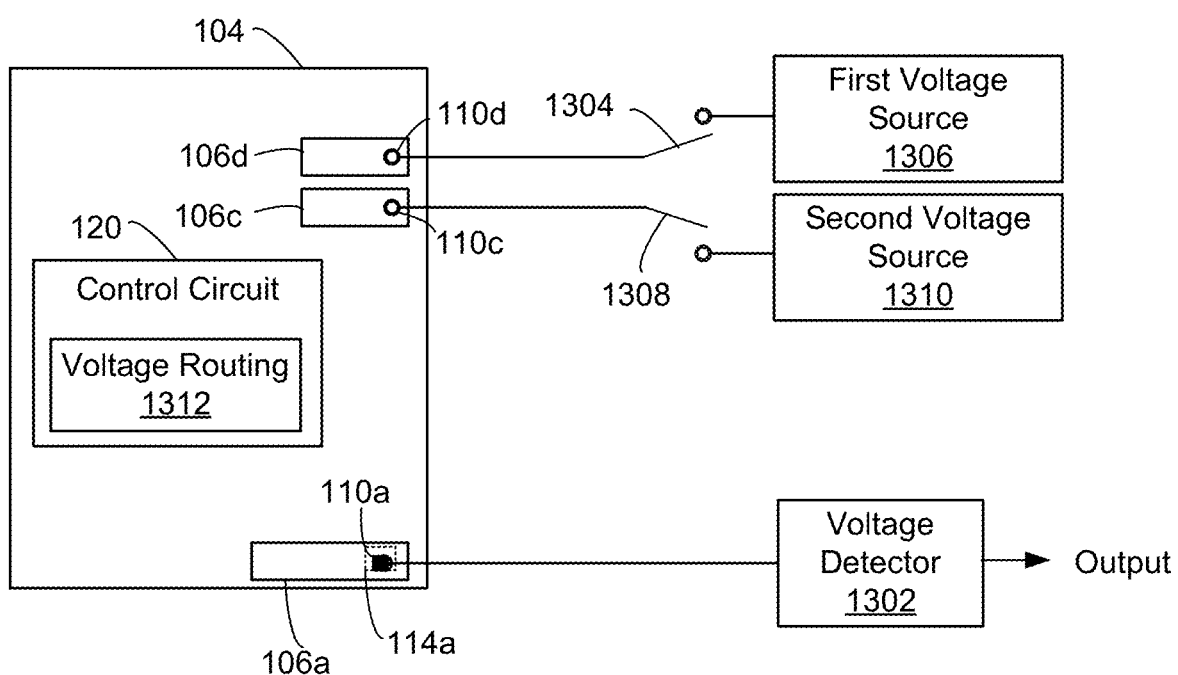
FIG. 13 depicts one embodiment in which the host device provides two voltages to the removable integrated circuit card.

FIG. 13 depicts one embodiment of a system in which the host device 102 provides two voltages to the removable integrated circuit card 104, the removable integrated circuit card 104 routes one of the received voltages to a capability pad 106a, and the host device senses the voltage at the capability pad 106a. One target location 114a is depicted on the removable integrated circuit card 104, but there could be more. The voltage detector 1302 is configured to sense a voltage at sense contact 110a. The sense contact 110a coincides with capability pad 106a. Switch 1304 is configured to connect first voltage source 1306 to electrical contact 110d. Thus, a voltage from first voltage source 1306 may be provided to interface pad 106d. Switch 1308 is configured to connect second voltage source 1310 to electrical contact 110c. Thus, a voltage from second voltage source 1310 may be provided to interface pad 106c. First voltage source 1306 has a different magnitude that second voltage source 1310. In one embodiment, first voltage source 1306 is a positive voltage and second voltage source 1310 is ground. In some embodiments, first voltage source 1306 is referred to as VD and second voltage source 1310 is referred to as Vs. The control circuit 120 in the removable integrated circuit card 104 has voltage routing 1312 that is configured to route one of the received voltages to capability pad 106a. In another embodiment, the removable integrated circuit card 104 has two capability pads 106a, wherein the voltage routing 1312 that is configured to route one of the received voltages to the second capability pad 106a. The removable integrated circuit card 104 could have three or more capability pads 106a, wherein the voltage routing 1312 is configured to route one of the received voltages to each of the additional capability pads 106a.

Figure 14:
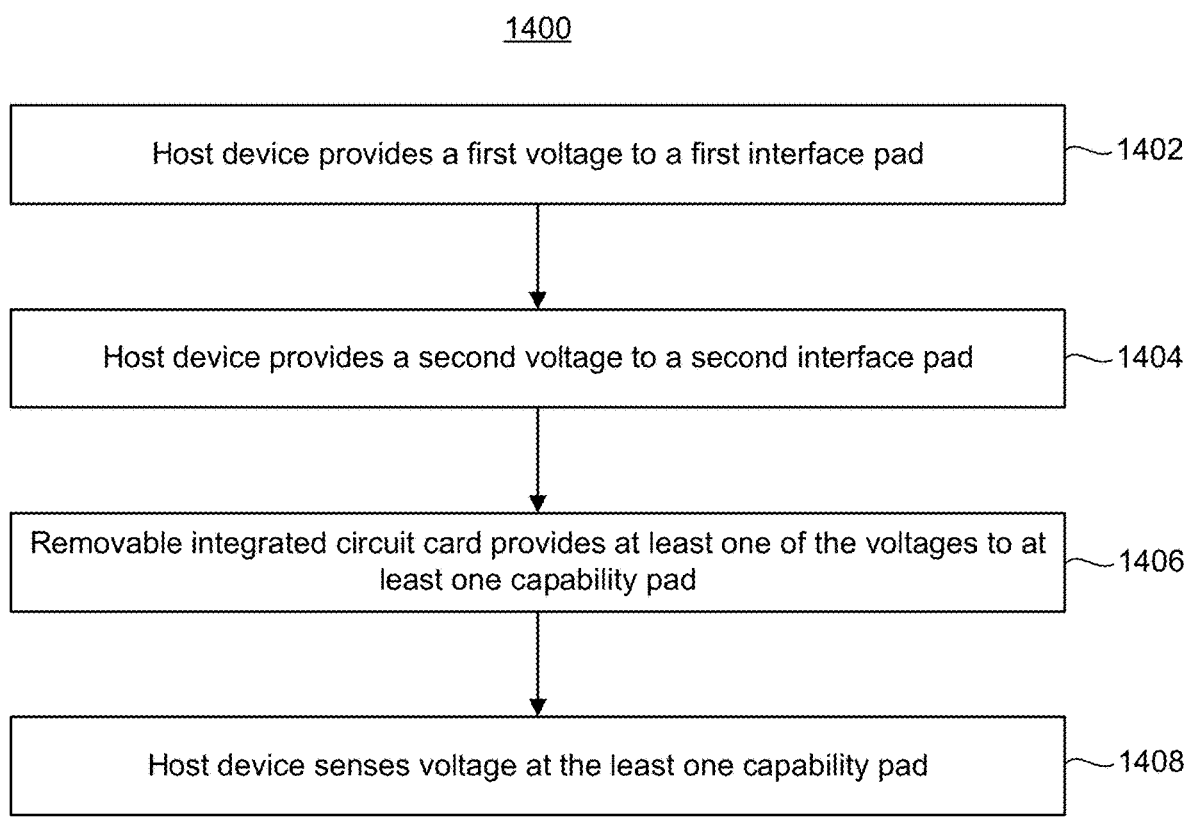
FIG. 14 depicts a flowchart of one embodiment of a process of determining a capability set based on voltages provided by a host device.

FIG. 14 depicts a flowchart of one embodiment of a process 1400 of determining a capability set based on voltages provided by a host device 102. Process 1400 will be discussed with respect to FIG. 14, which depicts one embodiment of host components. Process 1400 will be discussed with respect to FIGS. 5a-5d, but is not limited thereto. Process 1400 is one embodiment of step 204 in process 200.

Step 1402 includes the host device 102 providing a first voltage to a first interface pad 106d of the removable integrated circuit card 104. For example, with reference to FIGS. 5a-5d, the host device provides V to interface pad 106d. With respect to FIG. 13, switch 1304 is closed to connect first voltage source 1306 to electrical contact 110d.

Step 1404 includes the host device 102 providing a second voltage to a second interface pad 106c of the removable integrated circuit card 104. For example, with reference to FIGS. 5a-5d, the host device provides G to interface pad 106c. With respect to FIG. 13, switch 1308 is closed to connect second voltage source 1310 to electrical contact 110c.

Step 1406 includes the removable integrated circuit card 104 providing at least one of the voltages to at least one capability pad 106a. With respect to FIG. 14, the voltage routing may be used to route one of the voltages at either interface pad 106c or 106d to capability pad 106a. FIGS. 5a-5d depict four possibilities. In one embodiment, only one capability pad 106a is used. In one embodiment, more than two capability pads 106a are used.

Step 1408 includes the host device 102 sensing a voltage at the respective one or more capability pads 106a. FIG. 13 depicts voltage detector 1302 that may be used to sense the voltage at a capability pad. The voltage detector 1302 may include a comparator that has one input that receives a reference voltage and another input that is connected to sense contact 110a. The output of voltage detector 1302 may be provided to a capability determination unit, such as has been described with respect to FIGS. 6 and 7.

A first aspect of the disclosed technology includes an apparatus, comprising a card connector and one or more control circuits. The card connector is configured to receive a removable integrated circuit card having interface pads. The interface pads include one or more capability pads. The one or more control circuits are configured to sense a physical condition of the one or more capability pads when the removable integrated circuit card is in the card connector. The one or more control circuits are configured to determine a capability set of the removable integrated circuit card based on the physical condition of the one or more capability pads. The one or more control circuits are configured to operate the removable integrated circuit card based on the capability set.

In a second aspect of the disclosed technology in furtherance of the first aspect, the physical condition comprises a physical configuration of the one or more capability pads. The one or more control circuits are configured to determine the capability set of the removable integrated circuit card based on the physical configuration of the one or more capability pads.

In a third aspect of the disclosed technology in furtherance of either of the first or second aspects, the one or more control circuits are further configured to provide a voltage to a first end of a resistive element that has a second end connected to a target location on the removable integrated circuit card. The one or more control circuits are further configured to compare a magnitude of a voltage at the target location with a reference voltage in order to sense the physical condition of the one or more capability pads.

In a fourth aspect of the disclosed technology in furtherance of any of the first to third aspects, the one or more control circuits are further configured to: provide a voltage to a first end of a resistive element that has a second end connected to a first target location on the removable integrated circuit card, connect a second target location on the removable integrated circuit card to ground while the voltage is provided to the first end of the resistive element, and compare a magnitude of a voltage at the first target location with a reference voltage in order to sense the physical condition of the one or more capability pads.

In a fifth aspect of the disclosed technology in furtherance of any of the first to fourth aspects, to sense the physical condition of the one or more capability pads the one or more control circuits are further configured as follows. The one or more control circuits are further configured to provide a first voltage to a first end of a first resistive element that has a second end connected to a first target location on the removable integrated circuit card. The one or more control circuits are further configured to provide a second voltage to a first end of a second resistive element that has a second end connected to a second target location on the removable integrated circuit card. The second voltage is provided to the first end of the second resistive element while the first voltage is provided to the first end of the first resistive element. The one or more control circuits are further configured to compare a magnitude of a third voltage at the first target location with a first reference voltage. The one or more control circuits are further configured to compare a magnitude of a fourth voltage at the second target location with a second reference voltage.

In a sixth aspect of the disclosed technology in furtherance of any of the first to fifth aspects, the apparatus further comprises a first voltage source configured to provide a first voltage to a first interface pad of the interface pads. The apparatus further comprises a second voltage source configured to provide a second voltage to a second interface pad of the interface pads. The first voltage is greater than the second voltage. The one or more control circuits are further configured to sense a voltage at each of the one or more capability pads when the first voltage is provided to the first interface pad and the second voltage is provided to the second interface pad.

In a seventh aspect of the disclosed technology in furtherance of any of the first to sixth aspects, the one or more control circuits are further configured to sense an absence of a capability pad at one or more target locations on the removable integrated circuit card. The one or more control circuits are further configured to determine the capability set of the removable integrated circuit card based on the absence of a capability pad at the one or more target locations on the removable integrated circuit card.

In an eighth aspect of the disclosed technology in furtherance of any of the first to seventh aspects, the one or more control circuits are further configured to sense the physical condition of the one or more capability pads while the removable integrated circuit card is powered off.

In a ninth aspect of the disclosed technology in furtherance of any of the first to eighth aspects, the one or more control circuits are further configured to sense the physical condition of the one or more capability pads prior to the apparatus providing any commands to the removable integrated circuit card.

In a tenth aspect of the disclosed technology in furtherance of any of the first to ninth aspects, the removable integrated circuit card comprises a removable memory card. The removable memory card comprises non-volatile memory. The capability set comprises a voltage level at which the removable memory card is capable of operating.

In an eleventh aspect of the disclosed technology in furtherance of any of the first to tenth aspects, the one or more control circuits are configured to operate the removable integrated circuit card based on the capability set comprises the one or more control circuits configured to use at least one of the capability pads while operating the removable integrated circuit card based on the capability set.

In one embodiment, the apparatus includes a host device 102. The apparatus could be, but is not limited to, a desktop computer, laptop computer, a notepad computer, a digital camera, a cellular telephone, a personal digital assistant, a portable media player, an electronic keyboard, or a video game console.

One embodiment of the disclosed technology includes a method of operating a removable memory card. The method comprises providing a voltage to a first end of a resistive element in a host device. A second end of the resistive element is connected to a target location on a removable memory card in a card connector of the host device. The method comprises comparing a magnitude of a voltage at the target location with a reference voltage, and detecting a physical configuration of one or more capability pads of the removable memory card based on the comparison. The method comprises determining a capability set of the removable memory card based on the physical configuration of the one or more capability pads, and operating the removable memory card based on the capability set while the removable memory card is in the card connector of the host device.

One embodiment of the disclosed technology includes an apparatus comprising means for sensing a physical configuration of one or more capability pads of a removable memory card that is in a card connector of a host device. The apparatus also includes means for determining a capability set of the removable memory card based on the physical configuration of the one or more capability pads. The apparatus also include means for operating the removable memory card based on the capability set.

In one embodiment, the means for sensing a physical configuration of one or more capability pads of a removable memory card that is in a card connector of a host device comprises one or more of sensing circuit 112, sense contacts 110*a*, 110*b*, voltage detector 608, 708*a*, 708*b*, a comparator, a resistive element 604, 704, a resistor, a transistor, host processor 116, a PGA, an FPGA, and/or an ASIC. In one embodiment, the means for sensing a physical configuration of one or more capability pads of a removable memory card that is in a card connector of a host device performs steps 1002-1006 of process 1000.

In one embodiment, the means for determining a capability set of the removable memory card based on the physical configuration of the one or more capability pads comprises one or more of capability determination 610, capability determination 710, host processor 116, a PGA, an FPGA, and/or an ASIC. In one embodiment, the means for determining a capability set of the removable memory card based on the physical configuration of the one or more capability pads performs process 1100.

In one embodiment, the means for operating the removable memory card based on the capability set comprises one or more of capability determination 610, capability determination 710, host processor 116, a PGA, an FPGA, and/or an ASIC. In one embodiment, the means for operating the removable memory card based on the capability set performs process 1200.

In one embodiment, the means for sensing the physical configuration of the one or more capability pads comprises sensing means for coupling a voltage to one or more target locations on the removable memory card, the sensing means further for sensing a resultant voltage at each of the one or more target locations. In one embodiment, sensing means for coupling a voltage to one or more target locations on the removable memory card, the sensing means further for sensing a resultant voltage at each of the one or more target locations comprises one or more of sensing circuit 112, sense contacts 110*a*, 110*b*, voltage detector 608, 708*a*, 708*b*, a comparator, a resistive element 604, 704, a transistor, and a resistor.

In one embodiment, the means for determining the capability set of the removable memory card based on the physical configuration of the one or more capability pads comprises means for determining the capability set based on the resultant voltage at each of the one or more target locations. In one embodiment, the means for determining the capability set based on the resultant voltage at each of the one or more target locations comprises one or more of capability determination 610, capability determination 710, host processor 116, a PGA, an FPGA, and/or an ASIC. In one embodiment, the means for determining the capability set based on the resultant voltage at each of the one or more target locations performs process 1100.

One embodiment of the disclosed technology includes a removable memory card. A removable memory card comprises one or more control circuits configured to operate the removable memory card in accordance with a capability set. The plurality of interface pads are coupled to the one or more control circuits. The plurality of interface pads are configured to be received by a card connector of a host device. The plurality of interface pads comprise one or more capability pads that are configured to indicate the capability set based on a physical condition of the one or more capability pads when the plurality of interface pads are received by the card connector.

In a further embodiment of the removable memory card, the one or more capability pads are configured to indicate the capability set based on a physical configuration of the one or more capability pads. In one embodiment, the physical configuration is a size of a capability pad. In one embodiment, the physical configuration is a length of a capability pad. In one embodiment, the physical configuration is a number of capability pads.

In a further embodiment of the removable memory card, a first of the interface pads is configured to receive a high voltage, a second of the interface pads is configured to receive a low voltage, and the one or more control circuits are configured to provide at least one of the high voltage or the low voltage to respective ones of the one or more capability pads to indicate the capability set of the memory card.

In a further embodiment of the removable memory card, the one or more control circuits are configured to use at least one of the capability pads during operation of the removable memory card under the capability set. In one embodiment, the one or more control circuits are configured to use at least one of the capability pads during operation of the removable memory card to receive a power supply voltage. In one embodiment, the one or more control circuits are configured to use at least one of the capability pads during operation of the removable memory card for data communication with the host device. In one embodiment, the one or more control circuits are configured to use at least one of the capability pads during operation of the removable memory card to receive a clock signal from the host device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
 a card connector configured to receive a removable integrated circuit card having interface pads in a first region and a plurality of target locations in a second region, wherein the removable integrated circuit card comprises zero or more capability pads at the plurality of target locations; and
 one or more control circuits coupled to the card connector, wherein the one or more control circuits are configured to:

determine a presence or an absence of a capability pad at each of the plurality of target locations on the removable integrated circuit card when the removable integrated circuit card is in the card connector to determine a physical configuration of the zero or more capability pads from a plurality of physical configurations, wherein each of the plurality of physical configurations corresponds to a different capability set of a plurality of capability sets, determine which of the capability sets corresponds to the determined physical configuration of the zero or more capability pads, and operate the removable integrated circuit card based on the determined capability set.

2. The apparatus of claim 1, wherein the one or more control circuits are further configured to:

provide a voltage to a first end of a resistive element that has a second end connected to a first target location of the plurality of target locations on the removable integrated circuit card; and compare a magnitude of a voltage at the first target location with a reference voltage in order to determine the presence or absence of a capability pad at the first target location.

3. The apparatus of claim 1, wherein the one or more control circuits are further configured to:

provide a voltage to a first end of a resistive element that has a second end connected to a first target location of the plurality of target locations on the removable integrated circuit card;

connect a second target location of the plurality of target locations on the removable integrated circuit card to ground while the voltage is provided to the first end of the resistive element; and compare a magnitude of a voltage at the first target location with a reference voltage in order to determine the physical configuration of the zero or more capability pads.

4. The apparatus of claim 1, wherein to determine the physical configuration of the zero or more capability pads the one or more control circuits are further configured to:

provide a first voltage to a first end of a first resistive element that has a second end connected to a first target location of the plurality of target locations on the removable integrated circuit card;

provide a second voltage to a first end of a second resistive element that has a second end connected to a second target location of the plurality of target locations on the removable integrated circuit card, wherein the second voltage is provided to the first end of the second resistive element while the first voltage is provided to the first end of the first resistive element;

compare a magnitude of a third voltage at the first target location with a first reference voltage; and compare a magnitude of a fourth voltage at the second target location with a second reference voltage.

5. The apparatus of claim 1, further comprising:

a first voltage source configured to provide a first voltage to a first interface pad of the interface pads; and a second voltage source configured to provide a second voltage to a second interface pad of the interface pads, the first voltage is greater than the second voltage;

wherein the one or more control circuits are further configured to sense a voltage at each of the zero or more capability pads when the first voltage is provided to the first interface pad and the second voltage is provided to the second interface pad.

6. The apparatus of claim 1, wherein the one or more control circuits are further configured to:

sense an absence of a capability pad at any of the plurality of target locations on the removable integrated circuit card; and determine the capability set of the removable integrated circuit card based on the absence of a capability pad at any of the plurality of target locations on the removable integrated circuit card.

7. The apparatus of claim 1, wherein the one or more control circuits are further configured to:

determine presence or absence of a capability pad at each of the plurality of target locations while the removable integrated circuit card is powered off.

8. The apparatus of claim 1, wherein the one or more control circuits are further configured to:

sense at the plurality of target locations on the card prior to the apparatus providing any commands to the removable integrated circuit card.

9. The apparatus of claim 1, wherein:

the removable integrated circuit card comprises a removable memory card, the removable memory card comprising non-volatile memory; and the capability set comprises a voltage level at which the removable memory card is capable of operating.

10. The apparatus of claim 1, wherein the one or more control circuits configured to operate the removable integrated circuit card based on the determined capability set comprises:

the one or more control circuits configured to use at least one of the capability pads while operating the removable integrated circuit card based on the determined capability set.

11. An apparatus, comprising:

means for receiving a removable memory card having interface pads in a first region and a plurality of target locations in a second region, wherein the removable memory card comprises zero or more capability pads at the plurality of target locations;

means for determining a presence or an absence of a capability pad at each of the plurality of target locations on the removable memory card when the removable memory card is being received by the means for receiving a removable memory card;

means for determining a physical configuration of the zero or more capability pads from a plurality of physical configurations based on the presence or absence of a capability pad at each of the plurality of target locations, wherein each of the plurality of physical configurations corresponds to a different capability set of a plurality of capability sets;

means for determining which of the capability sets corresponds to the determined physical configuration of the zero or more capability pads; and means for operating the removable memory card based on the determined capability set.

12. The apparatus of claim 11, wherein the means for determining a presence or an absence of a capability pad at each of the plurality of target locations on the removable memory card is configured to:

provide a voltage to a first end of a resistive element in a host device, wherein a second end of the resistive element is connected to a first target location of a plurality of target locations; and compare a magnitude of a voltage at the first target location with a reference voltage.

13. The apparatus of claim 12, wherein the means for determining a presence or an absence of a capability pad at each of the plurality of target locations on the removable memory card is further configured to:
  connect a second target location of the plurality of target locations on the removable memory card to ground while the voltage is provided to the first end of the resistive element.

14. A method comprising:
  receiving, in a card connector of a host device, a removable memory card having interface pads in a first region and a plurality of target locations in a second region, wherein the removable memory card comprises zero or more capability pads at the plurality of target locations;
  determining, by the host device, a presence or an absence of a capability pad at each of the plurality of target locations on the removable memory card when the removable memory card is in the card connector;
  determining, by the host device, a physical configuration of the zero or more capability pads from a plurality of physical configurations based on the presence or absence of a capability pad at each of the plurality of target locations, wherein each of the plurality of physical configurations corresponds to a different capability set of a plurality of capability sets;
  determining, by the host device, which of the capability sets corresponds to the determined physical configuration of the zero or more capability pads; and
  operating, by the host device, the removable memory card based on the determined capability set.

15. The method of claim 14, wherein determining a presence or absence of a capability pad at each of the plurality of target locations on the removable memory card when the removable memory card is in the card connector comprises:
  providing a first voltage to a first end of a first resistive element in the host device, wherein a second end of the first resistive element is connected to a first target location on the removable memory card; and
  comparing a magnitude of a voltage at the first target location with a first reference voltage.

16. The method of claim 15, wherein determining a presence or absence of a capability pad at each of the plurality of target locations on the removable memory card when the removable memory card is in the card connector further comprises:
  connecting a second target location on the removable memory card to ground while the first voltage is provided to the first end of the first resistive element.

17. The method of claim 15, further comprising:
  providing a second voltage to a first end of a second resistive element in the host device, wherein a second end of the second resistive element is connected to a second target location on the removable memory card while the first voltage is provided to the first end of the first resistive element; and
  comparing a magnitude of a voltage at the second target location with a second reference voltage in order to detect the physical configuration of the zero or more capability pads of the removable memory card, wherein detecting the physical configuration of the zero or more capability pads of the removable memory card is further based on the comparison of the magnitude of the voltage at the second target location with the second reference voltage.

18. The method of claim 14, wherein:
  determining a presence or absence of a capability pad at each of the plurality of target locations on the removable memory card when the removable memory card is in the card connector is performed while the removable memory card is powered off.

19. The method of claim 14, wherein:
  determining a presence or absence of a capability pad at each of the plurality of target locations on the removable memory card when the removable memory card is in the card connector is performed prior to the host device exchanging information with the removable memory card as part of an initialization process of the removable memory card.

20. The method of claim 14, wherein operating the removable memory card based on the determined capability set comprises providing a voltage to a power supply interface pad of the removable memory card, wherein a magnitude of the voltage to the power supply interface pad depends on the determined capability set of the removable memory card.

* * * * *